United States Patent
Zhang

(10) Patent No.: US 9,111,801 B2
(45) Date of Patent: Aug. 18, 2015

(54) INTEGRATED CIRCUIT DEVICES AND FABRICATION TECHNIQUES

(71) Applicant: STMicroelectronics, Inc., Coppell, TX (US)

(72) Inventor: John H. Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 29 days.

(21) Appl. No.: 13/856,985

(22) Filed: Apr. 4, 2013

(65) Prior Publication Data

US 2014/0299936 A1 Oct. 9, 2014

(51) Int. Cl.
*H01L 21/04* (2006.01)
*H01L 27/12* (2006.01)
*H01L 29/66* (2006.01)
*H01L 21/84* (2006.01)
*H01L 27/11* (2006.01)

(52) U.S. Cl.
CPC .......... *H01L 27/1211* (2013.01); *H01L 21/845* (2013.01); *H01L 27/1108* (2013.01); *H01L 29/66795* (2013.01)

(58) Field of Classification Search
None
See application file for complete search history.

(56) References Cited

U.S. PATENT DOCUMENTS

| | | | | |
|---|---|---|---|---|
| 6,953,738 | B2 * | 10/2005 | Veeraraghavan et al. | 438/479 |
| 7,084,506 | B2 * | 8/2006 | Takao | 257/758 |
| 7,858,481 | B2 * | 12/2010 | Brask et al. | 438/299 |
| 2006/0084247 | A1 * | 4/2006 | Liu | 438/510 |
| 2006/0172497 | A1 * | 8/2006 | Hareland et al. | 438/286 |
| 2011/0018064 | A1 * | 1/2011 | Doornbos | 257/365 |
| 2011/0233675 | A1 * | 9/2011 | Mazure et al. | 257/347 |

OTHER PUBLICATIONS

Z. Liu et al., "An Independent-Gate FinFET SRAM Cell for High Data Stability and Enhanced Integration Density," IEEE International SoC Conference, 2007, pp. 63-66.
R. Wilson, "The Next Transistor: Planar, Fins, and SOI at 22 nm," http://www.edn.com/electronics-news/4368238/The-next-transistor-planar-fins-and-SOI-at-22-nm, accessed on Mar. 6, 2013.

* cited by examiner

*Primary Examiner* — Benjamin Sandvik
*Assistant Examiner* — Herve Assouman
(74) *Attorney, Agent, or Firm* — Seed IP Law Group PLLC

(57) ABSTRACT

Integrated circuit devices and fabrication techniques. A semiconductor device fabrication method may include doping, in a same processing step, first and second portions of a substrate of an integrated circuit. The first portion corresponds to a doped region of a semiconductor device. The second portion corresponds to a via contact. The method may further include, after the doping, forming the gate of the semiconductor device.

25 Claims, 23 Drawing Sheets

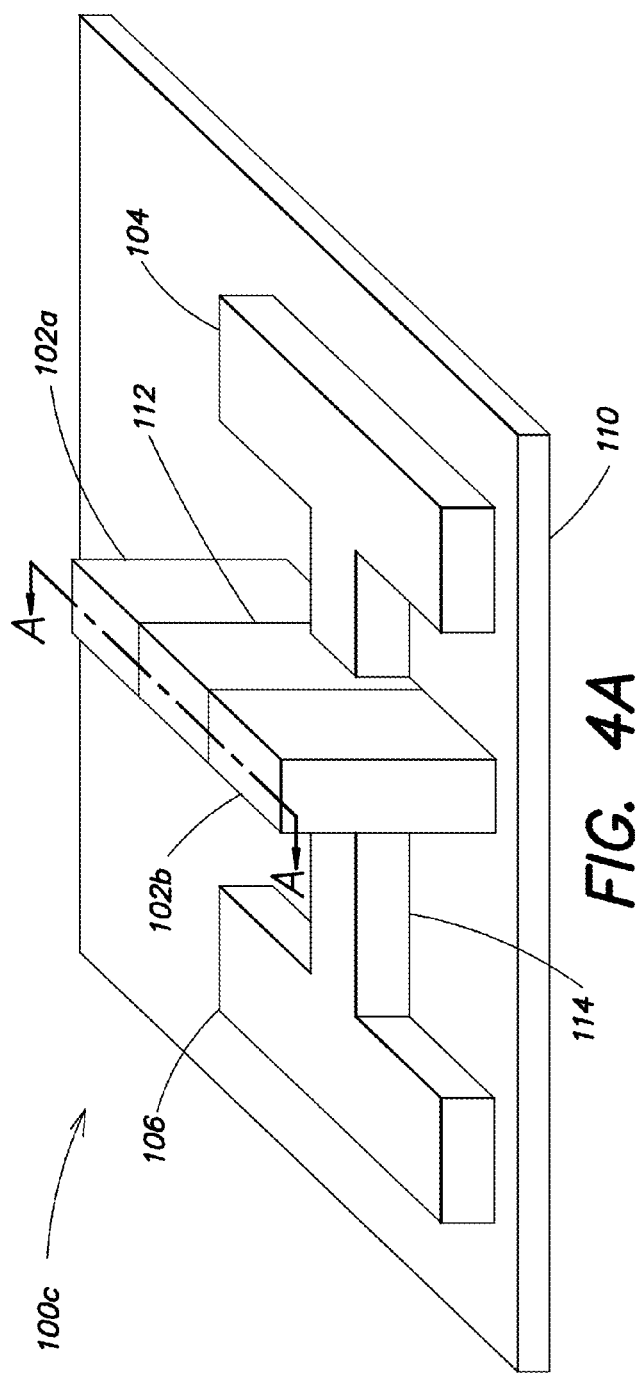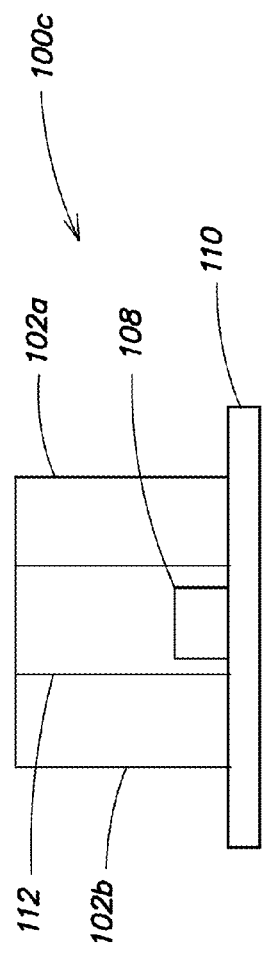
FIG. 4A
FIG. 4B

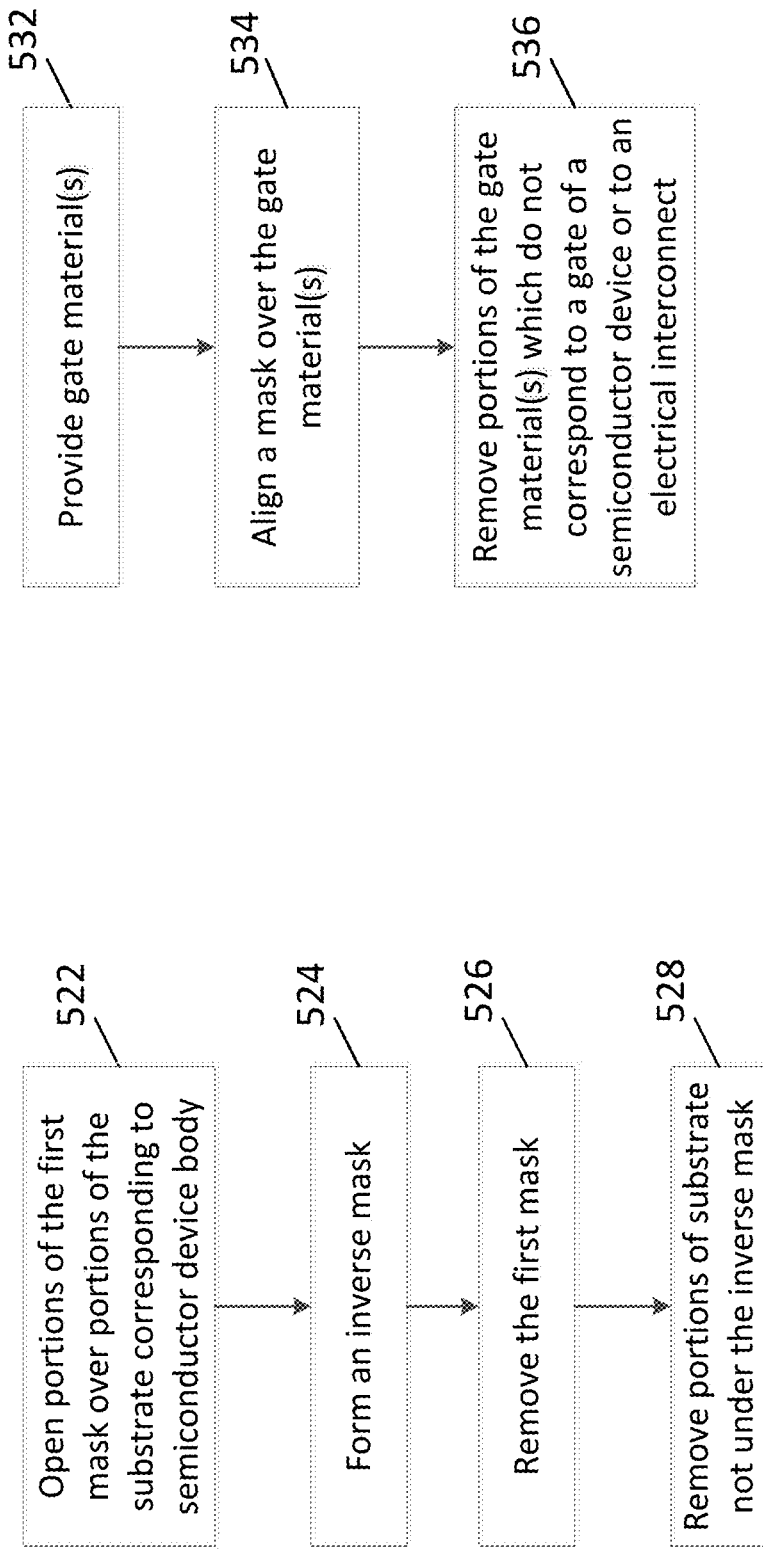

INTEGRATED CIRCUIT DEVICES AND FABRICATION TECHNIQUES

BACKGROUND

1. Technical Field

The present disclosure relates to integrated circuit devices and integrated circuit fabrication techniques. Some embodiments of the present disclosure relate particularly to a method of fabricating finFETs.

2. Discussion of the Related Art

The cost of manufacturing an integrated circuit (IC) is related to the number of process steps required to fabricate the IC. Reducing the number of process steps required to fabricate an IC may reduce the cost of manufacturing the IC in a number of ways. For example, reducing the number of process steps may decrease the duration of the fabrication process, thereby freeing up expensive resources, such as fabrication facilities and equipment, for use in the fabrication of additional ICs. As another example, reducing the number of process steps may increase the yield of the fabrication process, thereby reducing the cost per IC.

As semiconductor feature sizes have continued to shrink, conventional field-effect transistors (FETs) have increasingly suffered from problems such as short-channel effects, high leakage current, and high static power dissipation. Many alternatives to the conventional planar FET structure have been studied, including the non-planar finFET. A finFET is a field-effect transistor in which a portion of the transistor's semiconductor material forms a fin-like structure. Relative to conventional planar FETs, a finFET may exhibit reduced short-channel effects, leakage current, and/or static power dissipation.

Methods of fabricating finFETs on integrated circuits are known. For example, a conventional finFET fabrication process may include the following steps: formation and filling of trenches between the finFET and other semiconductor devices for shallow-trench isolation; removal of portions of the semiconductor substrate to form a fin; formation of sidewall spacers for a dummy gate; formation of the dummy gate to shield the body of the finFET from the dopants; implantation of dopants into the finFET's source and drain regions; annealing of the integrated circuit to activate the dopants; removal of the dummy gate; and formation of the real finFET gate between the spacers, so that the gate aligns with the finFET's undoped body region. During implantation of dopants, the dummy gate may shield the body of the finFET from the dopants.

SUMMARY

According to an embodiment, there is provided a semiconductor device fabrication method. The method includes forming a fully-depleted channel of a finFET in a cell of a static random-access memory (SRAM) by doping, in a same processing step, portions of a silicon-on-insulator (SOI) substrate of an integrated circuit. A first of the portions corresponds to a first doped region of a finFET. A second of the portions corresponds to a second doped region of the finFET. A third of the portions corresponds to a via contact. The method further includes, after the doping, forming a gate of the finFET.

According to another embodiment, there is provided a semiconductor device fabrication method. The method includes doping, in a same processing step, first and second portions of a substrate of an integrated circuit. The first portion corresponds to a doped region of a semiconductor device. The second portion corresponds to a via contact. The method further includes, after the doping, forming the gate of the semiconductor device.

According to another embodiment, there is provided an integrated circuit including a semiconductor device fabricated by the method described in the preceding paragraph.

BRIEF DESCRIPTION OF THE DRAWINGS

For an understanding of some embodiments, reference will now be made by way of example only to the accompanying Figures in which:

FIGS. 4A and 4B show views of an independent-gate finFET 100c (in particular, a perspective view and a cross-sectional view along line A-A, respectively), according to some embodiments;

FIG. 5C shows a flowchart of a method of isolating doped regions of semiconductor devices from each other, according to some embodiments;

FIG. 5D shows a flowchart of a method of forming a gate of a semiconductor device, according to some embodiments;

Figure 1:
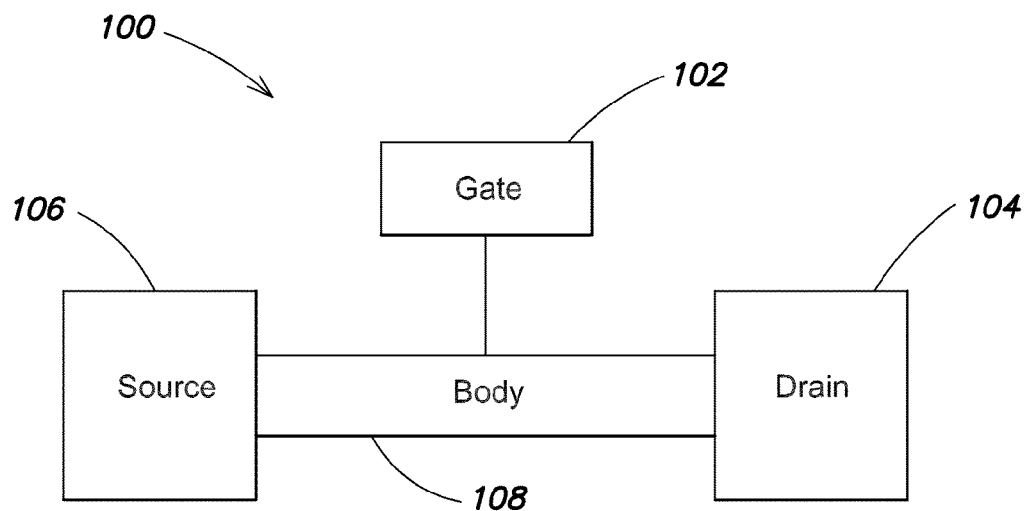
FIG. 1 shows a block diagram of a field effect transistor (FET) 100, according to some embodiments.

For clarity, the same elements have been designated with the same reference numerals in the different drawings and, further, as usual in the representation of integrated circuits, the various drawings are not to scale. For clarity, only those steps and elements which are useful to the understanding of the described embodiments have been shown and will be discussed.

DETAILED DESCRIPTION

Conventional finFET fabrication methods may require a large number of fabrication processing steps and/or rely on fabrication techniques that are unlikely to scale to processing nodes with smaller feature sizes (e.g., features sizes of 65 nm or less). The inventors have recognized and appreciated that a simpler process for fabricating finFETs (e.g., a process with fewer processing steps and/or processing steps that scale to feature sizes of 65 nm or less) may increase fabrication yields and reduce fabrication expenses.

According to an embodiment, a semiconductor fabrication method may include a doping step in which dopants are implanted in portions of an integrated circuit substrate corresponding to doped regions of a finFET and a via contact. The method may also include a gate-formation step, performed after the doping step, in which the gate of the semiconductor device is formed.

In some embodiments, during the same process step in which the finFET gate is formed, a local interconnect coupling the gate of the finFET to a via contact may be formed from the same material as the finFET gate.

In some embodiments, the device produced by the semiconductor fabrication method may be an SRAM, and the finFET may be an element of an SRAM cell.

In some embodiments, the method may also include an isolation step, performed after the doping step, in which doped regions of different finFETs are isolated from each other.

In some embodiments, the fin channel of the integrated circuit may be a fully-depleted silicon-on-insulator (FDSOI) substrate.

The features described above, as well as additional features, are described further below. These features may be used individually, all together, or in any combination, as the technology is not limited in this respect.

FIG. 1 shows a block diagram of a field effect transistor (FET) 100, according to some embodiments. FET (100) includes a gate 102, two doped regions (drain 104 and source 106), and a body region 108. When FET 100 is suitably biased, a channel may form in body region 108 between drain 104 and source 106. The conductivity of the channel may be controlled, at least in part, by a voltage (VGS) applied across the gate and source terminals. When a voltage (VDS) is applied across the drain and source terminals, current may flow through the channel.

In some embodiments, portions of a semiconductor device such as FET 100 may be formed in and/or on a semiconductor substrate. In some embodiments, a substrate may include silicon, silicon germanium, silicon carbide, and/or other material(s) known to one of ordinary skill in the art or otherwise suitable for fabricating semiconductor devices. In some embodiments, a substrate may be a bulk substrate, a silicon-on-insulator (SOI) substrate, a strained-silicon-direct-on-insulator (SSDOI) substrate, a strained heterostructure-on-insulator (HOT) substrate, or any other type of substrate known to one of ordinary skill in the art or otherwise suitable for fabricating semiconductor devices. In some embodiments, portions of a substrate may be partially or fully depleted of charge carriers. In some embodiments, portions of a substrate may be strained. For example, portions of a substrate which are configured to operate as transistor channels may be tensiley or compressively strained to enhance the mobility of charge carriers in the channels.

In some embodiments, the doped regions of a semiconductor device (e.g., drain 104 and source 106 of FET 100) may be regions of a semiconductor substrate that are doped (e.g., heavily doped) with charge carriers. The charge carriers may be introduced into the doped regions and activated through techniques known to one of ordinary skill in the art or otherwise suitable for modifying the electrical properties of a region of a semiconductor substrate, including but not limited to ion implantation and annealing.

The gate of a semiconductor device (e.g., gate 102 of FET 100) may include, for example, polysilicon, one or more metallic materials, and/or any other materials known to one of ordinary skill in the art or otherwise suitable for forming a gate. In some embodiments, the gate and channel of a semiconductor device, such as FET 100, may be separated from each other by a dielectric layer. In some embodiments, the dielectric layer may include a dielectric material such as polysilicon, a high-k dielectric material (e.g., a material having a dielectric constant higher than the dielectric constant of polysilicon), and/or any other material known to one of ordinary skill in the art or otherwise suitable for insulating a transistor gate and channel from each other. For example, a dielectric layer may include hafnium oxide ($HfO_2$).

In some embodiments, the gate of a semiconductor device (e.g., gate 102 of FET 100) may include or be partially or fully covered by a spacer layer, a liner, a capping layer, and/or any other type of 'gate-covering layer.' A gate-covering layer may be formed near the gate of a semiconductor device (e.g., over the gate and/or adjacent to the sidewalls of the gate) by techniques known to one of ordinary skill in the art or otherwise suitable for forming a gate-covering layer, including but not limited to deposition and photolithographic patterning of a gate-covering material. In some embodiments, a gate-covering layer may include a nitride and/or an oxide, such as silicon nitride (SiN) or silicon oxide (SiO). In some embodiments, a gate-covering layer may insulate the gate from other portions of the integrated circuit, facilitate a self-aligning transistor fabrication process, apply stress to the transistor channel, etc.

Figure 2:
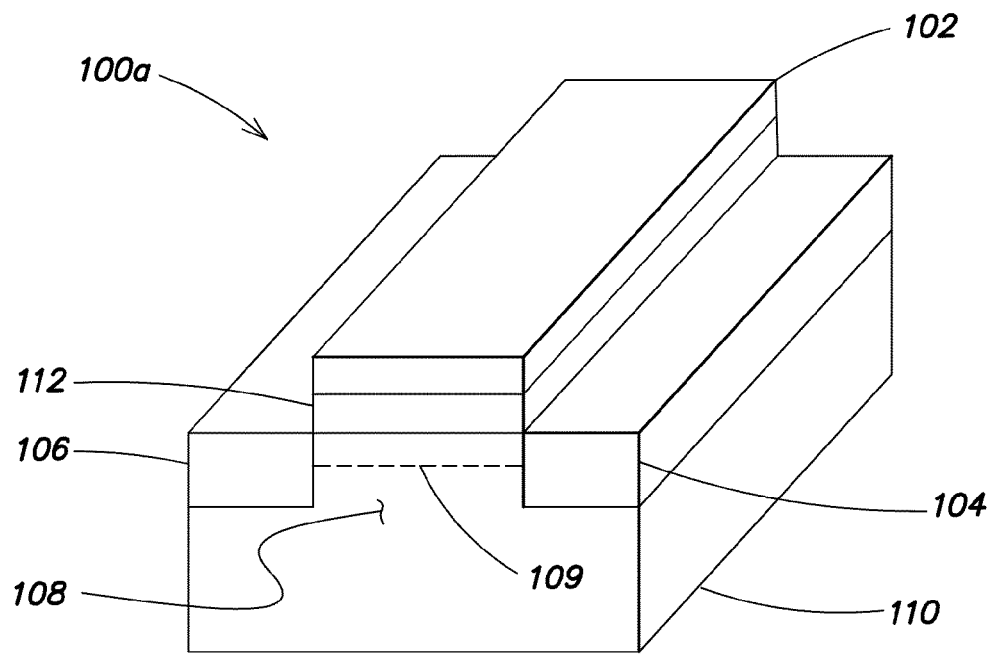
FIG. 2 shows a perspective view of a planar FET 100a, according to some embodiments.

FIG. 2 shows a perspective view of a planar FET 100a, according to some embodiments. In the example of FIG. 2, FET 100a includes a body region 108, drain 104, and source 106 formed in a semiconductor substrate 110, a dielectric layer 112 formed over the channel portion 109 of body region 108, and a gate 102 formed over dielectric layer 112. In planar FET 100a, the surface of body region 108 over which dielectric layer 112 and gate 102 are formed is planar.

Figure 3A:
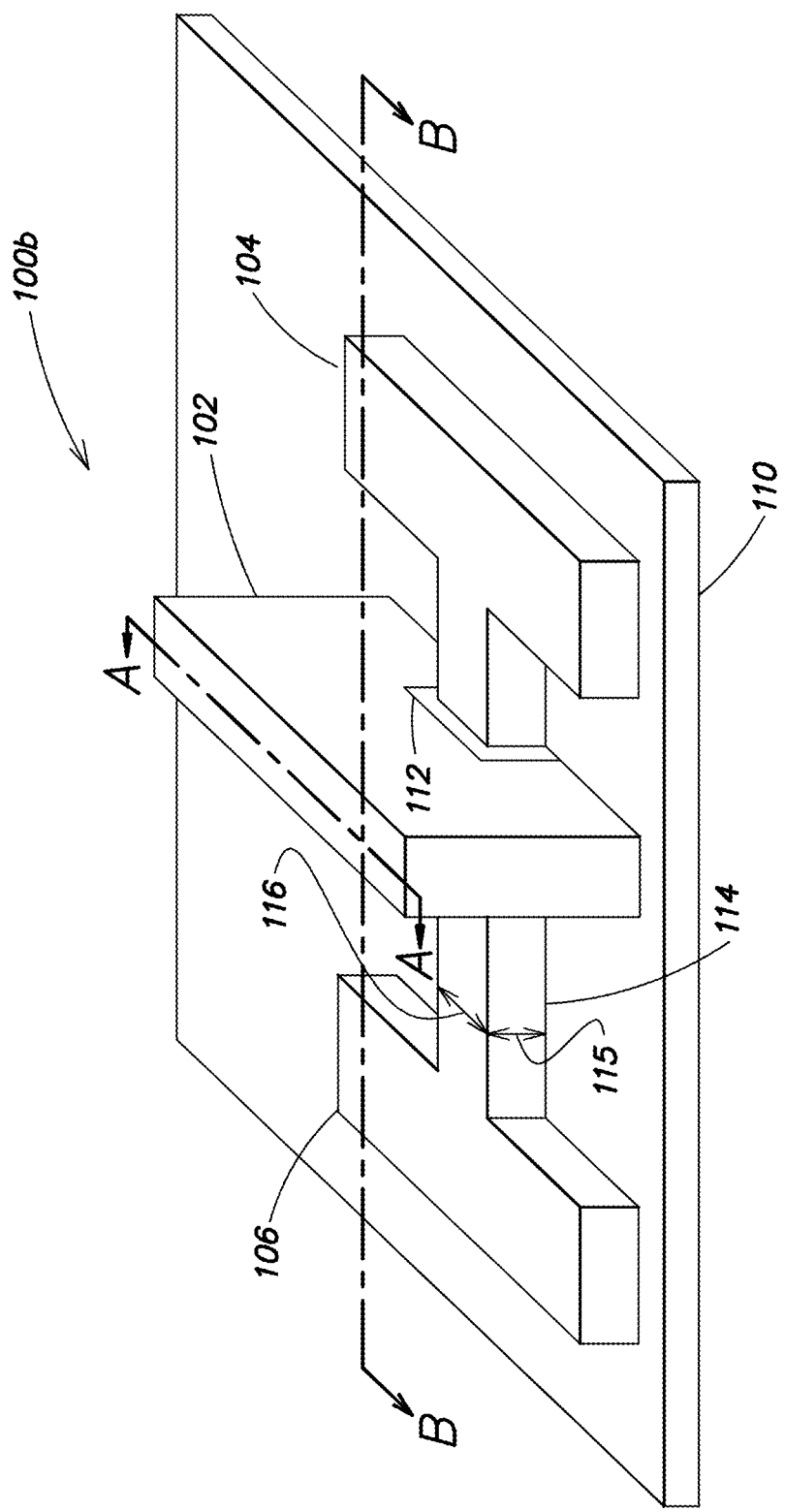
FIGS. 3A, 3B, and 3C show views of a finFET 100b (in particular, a perspective view, a cross-sectional view along line B-B, and a cross-sectional view along line A-A, respectively), according to some embodiments.
Figure 3B:
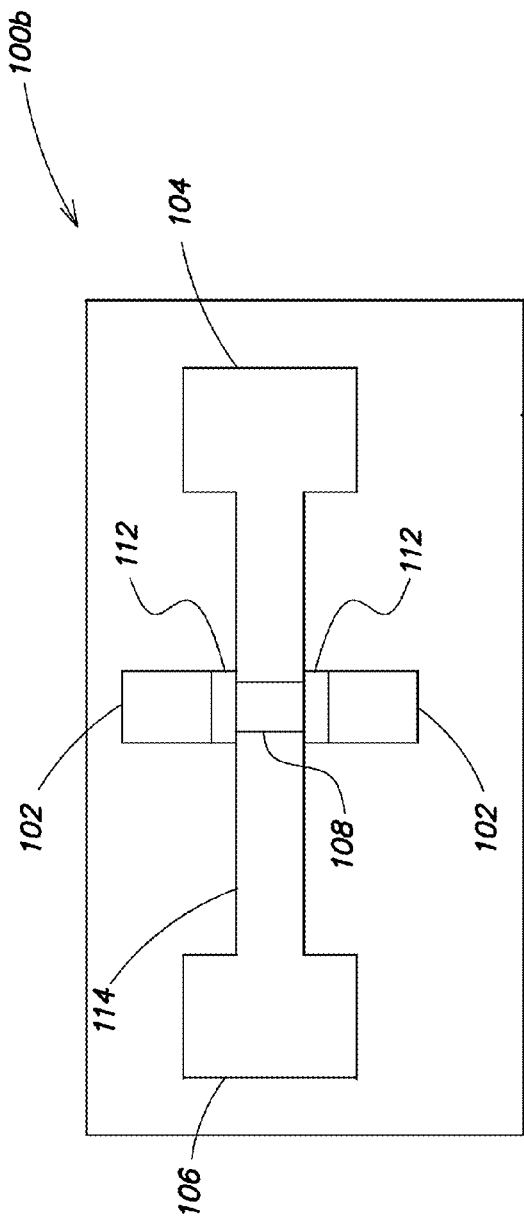
Figure 3C:
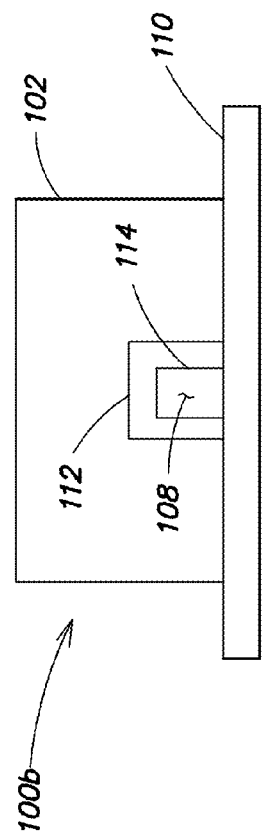

FIGS. 3A, 3B, and 3C show views of a finFET 100b, according to some embodiments. FIG. 3A shows a perspective view of finFET 100b. FIG. 3B shows a cross-sectional view of finFET 100b along line B-B. FIG. 3C shows a cross-sectional view of finFET 100b along line A-A.

In some embodiments, a finFET may be a FET in which a fin structure includes at least a portion of the transistor body. In the example of FIGS. 3A-3C, finFET 100b includes a fin 114 which protrudes upward from substrate 110 and in which body region 108 is formed. In some embodiments, a fin 114 may be a semiconductor structure which protrudes from, is suspended over, or is layered over a portion of substrate 110. In some embodiments, fin 114 may be formed from substrate 110 (e.g., by removing portions of substrate 110 adjacent to fin 114). In some embodiments, fin 114 may be formed from a semiconductor layer of substrate 110, and portions of substrate 110 below fin 114 may be formed from a buried oxide (BOX) layer of substrate 110. In the example of FIGS. 3A-3C, fin 114 also includes at least portions of drain 104 and source 106.

In some embodiments, fin 114 may be a thin structure. For example, the thickness 116 of fin 114 may be less than its height 115 (e.g., the thickness may be between 5% and 80% of the height, between 5% and 75% of the height, between 5% and 60% of the height, between 5% and 50% of the height, between 5% and 40% of the height, between 5% and 25% of the height, or between 5% and 20% of the height). As just one example, the height 115 and thickness 116 of fin 114 may be 32 nm and 8 nm, respectively.

Embodiments of fin 114 are not limited by the properties of the fin or by the method of fabricating the fin. In some embodiments, a fin's configuration (e.g., shape, orientation, material composition, etc.) may be a configuration known to one of ordinary skill in the art or otherwise suitable for a fin structure. Embodiments of fin 114 may be formed using any technique known to one of ordinary skill in the art or otherwise suitable for forming a fin structure.

FinFET 100b also includes a gate 102 and dielectric layer 112 which insulates the gate from body region 108 of fin 114. In the embodiment of FIGS. 3A-3C, gate 102 wraps around fin 114, such that portions of gate 102 are over body region 108 (e.g., adjacent to an upper surface of the body region), and portions of gate 102 are beside body region 108 (e.g., adjacent to sidewalls of the body region). In some embodiments, portions of gate 102 may be over, above, beside, below, and/or under body region 108. In the embodiment of FIGS. 3A-3C, gate 102 is structured as a single electrical node. FinFETs in which a gate is structured as a single electrical node may be referred to as 'dependent-gate' finFETs. In some embodiments, gate 102 may be structured as two or more independent electrical nodes. FinFETs in which the gate 102 is structured as two or more independent electrical nodes may be referred to as 'independent-gate' finFETs.

Figure 3D:
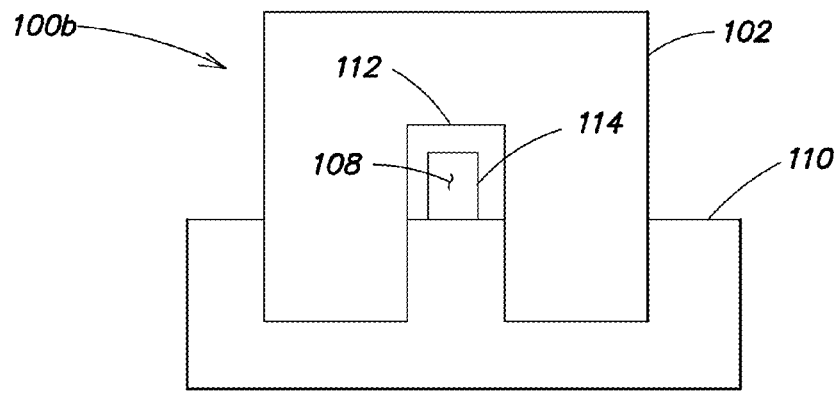
FIG. 3D shows a cross-sectional view of a finFET 100b, according to another embodiment.
Figure 3E:
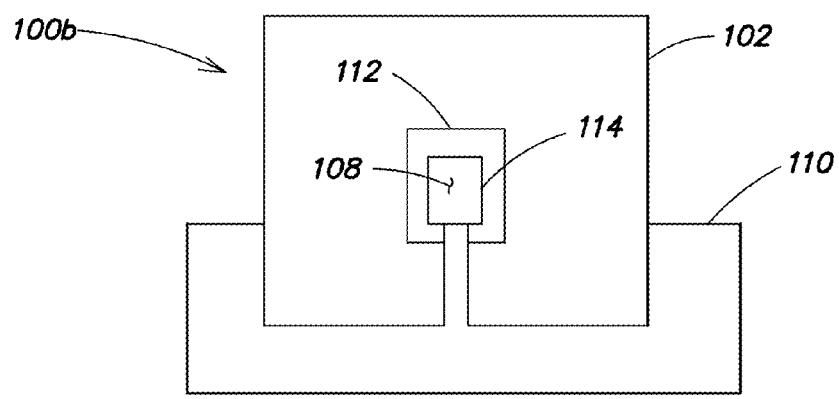
FIG. 3E shows a cross-sectional view of a finFET 100b, according to another embodiment.
Figure 3F:
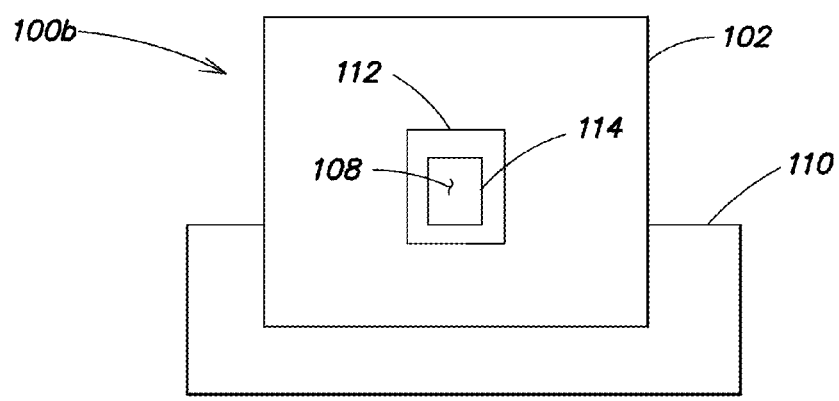
FIG. 3F shows a cross-sectional view of a finFET 100b, according to another embodiment.

FIGS. 3D-3F show cross-sectional views of finFET 100b, according to some other embodiments. In the embodiments of FIGS. 3D-3F, portions of gate 102 are below body region 108 of fin 114. In the embodiment of FIG. 3D, which may be referred to as a pi-gate finFET, portions of gate 102 are below body region 108 of fin 114 but not under body region 108 of fin 114. In the embodiment of FIG. 3E, which may be referred to as an omega-gate ($\Omega$-gate) finFET, portions of gate 102 are both below and under body region 108 of fin 114. In the embodiment of FIG. 3F, which may be referred to as a gate-all-around finFET, gate 102 forms a ring around body region 108 of fin 114, such that all portions of body region 108 are beside, above, and below portions of gate 102.

FIGS. 4A and 4B show views of an independent-gate finFET 100c, according to some embodiments. FIG. 4A shows a perspective view of independent-gate finFET 100c. FIG. 4B shows a cross-sectional view of independent-gate finFET 100c along line A-A. In an independent-gate finFET, the gate may be structured as two or more independent nodes. In the example of FIGS. 4A and 4B, the finFET gate is structured as two independent nodes, 102a and 102b.

Figure 4C:
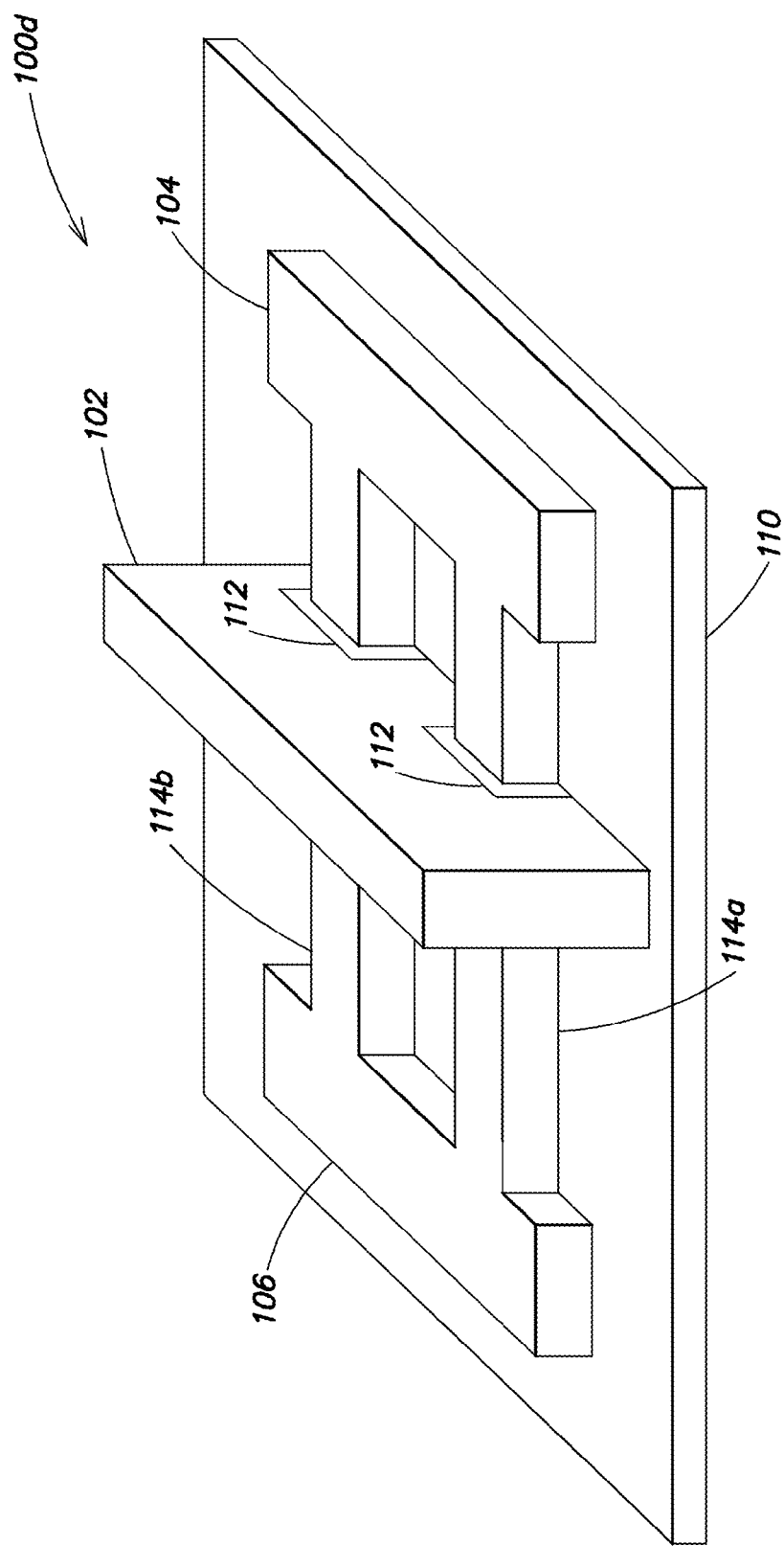
FIG. 4C shows a perspective view of a segmented-fin finFET 100d, according to some embodiments.

FIG. 4C shows a perspective view of a segmented-fin finFET 100d, according to some embodiments. In a segmented-fin finFET, the transistor's body region may be segmented among two or more fins. In the example of FIG. 4C, the transistor's body region (not shown) is segmented among two fins 114a and 114b.

Embodiments are not limited to the finFET structures illustrated in FIGS. 3-4 and described above. Embodiments may include (or be used to fabricate) any finFET structure known to one of ordinary skill in the art or otherwise suitable for operating as a finFET, including but not limited to segmented-fin finFETs with any number of fins, finFETs with any number of independent and/or dependent gates, finFETs with fins of any shapes or dimensions, finFETs with gates of any shape, etc.

Figures 5A, 5B:
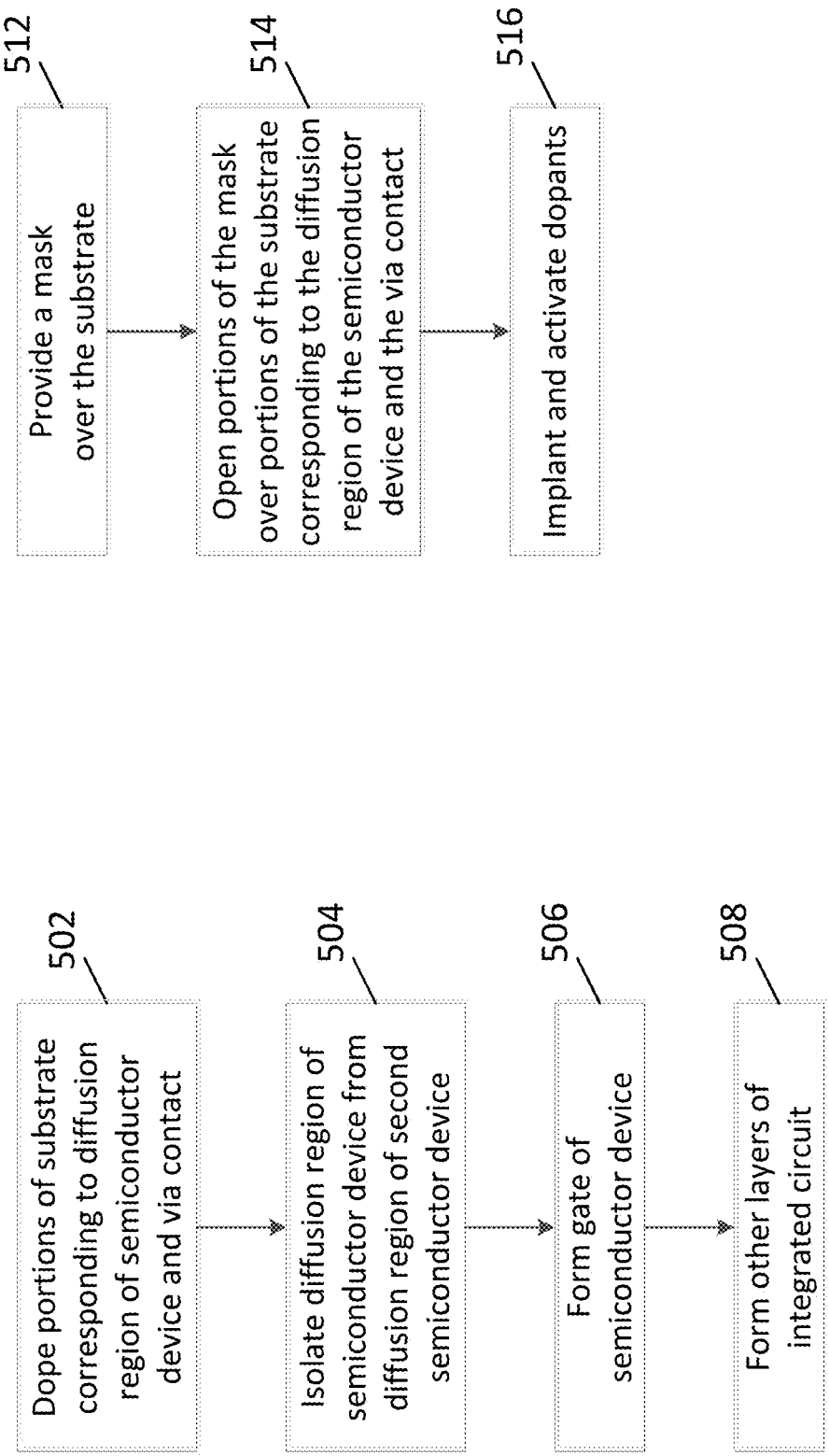
FIG. 5A shows a flowchart of a method of fabricating a semiconductor device, according to some embodiments.
FIG. 5B shows a flowchart of a method of doping portions of the semiconductor substrate, according to some embodiments.

FIG. 5A shows a flowchart of a method of fabricating a semiconductor device, according to some embodiments. In step 502 of the method of FIG. 5A, portions of the semiconductor substrate are doped. The doped portions correspond to a doped region of a semiconductor device and a via contact. In some embodiments the semiconductor device may be, for example, a finFET, and the doped region may be a source or drain of the finFET. In some embodiments, a via contact may be an opening in an insulating layer through which a doped region of a semiconductor substrate is conductively coupled to an interconnect layer of an integrated circuit. In some embodiments, the portions of a substrate corresponding to doped regions of semiconductor devices and to via contacts may be doped in a same process step of a semiconductor fabrication process. Forming drain/source doped regions and via contact doped regions in a same processing step may facilitate alignment of semiconductor device terminals (e.g., drains and sources) with via contacts, thereby allowing the fabrication process to more easily scale to process nodes with smaller feature sizes.

In some embodiments, the method of FIG. 5A may be a gate-last process (i.e., a process in which the gate of a semiconductor device is fabricated after the doped regions of the semiconductor device have been doped). In some gate-last embodiments of the method of FIG. 5A, dummy gates and/or sidewall spacers may not be used to align a semiconductor device's later-formed gate with the device's earlier-formed doped regions. In this manner, embodiments of FIG. 5A may reduce the number of process steps used to fabricate a semiconductor device, relative to conventional fabrication processes.

FIG. 5B shows a flowchart of a method of doping portions of the semiconductor substrate, according to some embodiments. In some embodiments, step 502 of the method of FIG.

5A may be performed according to the method of FIG. 5B. In step 512 of FIG. 5B, a mask is provided over a semiconductor substrate of an integrated circuit. The mask may be provided using any technique known to one of ordinary skill in the art or otherwise suitable for masking an integrated circuit, including but not limited to depositing the mask or growing the mask. In some embodiments the mask may be a hard mask, such as a silicon nitride (SiN) mask or a silicon oxide (SiO) mask.

In step 514 of FIG. 5B, the mask is opened. In some embodiments, opening the mask includes removing portions of the mask over a portion of the substrate that corresponds to a doped region of the semiconductor device and over a portion of the substrate that corresponds to a via contact. The mask may be opened using any technique known to one of ordinary skill in the art or otherwise suitable for opening a mask, including but not limited to patterning the mask and etching the mask. For example, in some embodiments, photolithographic patterning and plasma etching or reactive ion etching (RIE) may be used to open the mask.

In step 516 of FIG. 5B, dopants are implanted into the semiconductor substrate through the open portions of the mask, and the implanted dopants are activated. Dopants may be implanted in the substrate using techniques known to one of ordinary skill in the art or any other suitable techniques for modifying the electrical properties of a region of a semiconductor substrate, including but not limited to ion implantation. In some embodiments, different dopants may be implanted in the doped regions of p-channel FETs and n-channel FETs. The implanted dopants may be activated using techniques known to one of ordinary skill in the art or any other suitable techniques, including but not limited to annealing the integrated circuit.

In some embodiments, the implantation of dopants may be controlled to achieve full or partial depletion of charge carriers from a portion of the substrate corresponding to the channel region of a semiconductor device. In embodiments where full or partial depletion of charge carriers is performed, the integrated circuit's semiconductor substrate may be a fully-depleted silicon-on-insulator (FDSOI) substrate (e.g., an SOI substrate in which the thickness of the semiconductor layer over the buried oxide layer is between 1 nm and 45 nm, between 2 nm and 35 nm, or between 2 nm and 10 nm). Performing full or partial depletion of charge carriers from a semiconductor device's channel region may reduce the impact of short-channel effects and/or barrier-induced leakage on the operations of the semiconductor device.

The method illustrated in FIG. 5B is just one example of a method of doping portions of a substrate. In some embodiments, techniques known to one of ordinary skill in the art or otherwise suitable for doping portions of a semiconductor substrate may be used.

In step 504 of the method of FIG. 5A, the portion of the substrate that corresponds to the doped region of the semiconductor device is isolated from a portion of the substrate that corresponds to a doped region of a second semiconductor device. In some embodiments, the second semiconductor device may be finFET, and the doped region of the second semiconductor device may be a source or drain. In some embodiments, two doped regions may be partially or fully isolated from each other when portions of the substrate located between the doped regions are removed, and/or when an insulating material is interposed between the doped regions. In some embodiments, the techniques used to isolate the doped regions of semiconductor devices from each other may also result in the formation of fin structures for the semiconductor devices.

FIG. 5C shows a flowchart of a method of isolating doped regions of semiconductor devices from each other, according to some embodiments. In some embodiments, the method of FIG. 5C may be applied to an integrated circuit which includes a first mask with openings over portions of the substrate corresponding to the doped regions of the semiconductor devices. In some embodiments, the mask may also have openings over portions of the substrate which correspond to one or more via contacts. In step 522 of the method of FIG. 5C, additional portions of the first mask are opened. The additional openings may be over portions of the substrate corresponding to the bodies of the semiconductor devices. As in step 514 of FIG. 5B, the mask may be opened using any technique known one of ordinary skill in the art or otherwise suitable for opening a mask.

In step 524 of FIG. 5C, an inverse mask is formed in the openings of the first mask. In some embodiments, the inverse mask may be formed over portions of the substrate corresponding to doped regions and body regions of semiconductor devices (e.g., the fin structures of finFETs) and/or to via contacts. In some embodiments, the inverse mask may be formed by providing a second mask over the first mask. In some embodiments, the second mask may be formed from a different material in the first mask. For example, in embodiments where the first mask is a nitride material, the second mask may be in oxide material, such as silicon oxide (SiO). In embodiments where the first mask is in oxide material, the second mask may be a nitride material, such as silicon nitride (SiN). As in step 512 of FIG. 5B, the second mask may be provided using any technique known to one of ordinary skill in the art or otherwise suitable for masking an integrated circuit. When the second mask is provided, portions of the second mask may partially or fully fill the openings in the first mask.

In some embodiments, the inverse mask may be formed from the second mask by removing portions of the second mask that are not located in openings of the first mask. The portions of the second mask that are not located in openings of the first mask may be removed using techniques known to one of ordinary skill in the art or any other techniques suitable for removing portions of a mask, including but not limited to chemical-mechanical polishing (CMP). For example, a chemical-mechanical polishing step may be performed to remove portions of the second mask that are over the first mask, leaving the first mask intact with the openings in the first mask filled by portions of the second mask.

In step 526 of FIG. 5C, the first mask may be removed from the integrated circuit, leaving an inverse mask over the portions of the substrate that were accessible through the openings in the first mask. The first mask may be removed using techniques known to one of ordinary skill in the art or any other suitable techniques for removing the material of the first mask without removing the material the second mask. For example, in some embodiments, plasma etching or reactive ion etching may be used to remove the first mask without removing the second mask (and portions of the substrate below the second mask).

In step 528 of FIG. 5C, at least some portions of the substrate which are not covered by the inverse mask are removed. Portions of the substrate may be removed using techniques known to one of ordinary skill in the art or otherwise suitable for removing portions of a semiconductor substrate, including but not limited to plasma etching or reactive ion etching. In some embodiments, removal of portions of the substrate not covered by the inverse mask may result in the formation of fins corresponding to drains, sources, and/or body regions of finFETs.

In some embodiments, the portions of the substrate removed during step 528 may include a particular portion of the substrate located between the doped regions of two semiconductor devices. In some embodiments, the substrate may be a silicon-on-insulator (SOI) substrate, and the particular portion of the substrate removed during step 528 may border on the portions of the substrate corresponding to the doped regions of the semiconductor devices, and on a buried oxide (BOX) layer of the substrate. In some embodiments, the substrate may be a bulk substrate, and the particular portion of the substrate removed during step 528 may border on the portions of the substrate corresponding to the doped regions of the semiconductor devices, and on an underlying layer of the substrate.

In some embodiments, after removal of portions of the substrate during step 528, the portions of the substrate corresponding to the doped regions of the semiconductor devices may be partially or fully isolated from each other (e.g., not coupled to each other) in the layer in which they are formed. In some embodiments, the particular portion of the substrate removed during step 528 may constitute a minimum percentage of the undoped, non-body portions of the substrate within a specified region of the substrate, such as a rectangular box-shaped region, that includes the doped regions of the semiconductor devices. The specified percentage may be, for example, any percentage between 5% and 100%.

The method illustrated in FIG. 5C is just one example of a method of isolating doped regions of semiconductor devices from each other. In some embodiments, techniques known to one of ordinary skill in the art or otherwise suitable for isolating regions of the semiconductor substrate from each other may be used, including but not limited to shallow trench isolation or deep trench isolation. However, the isolation method of FIG. 5C may scale more easily to process nodes with small feature sizes (e.g., 32 nm or less).

In step 506 of the method of FIG. 5A, the gate of the semiconductor device is formed. In some embodiments, prior to forming the gate, an inverse mask may be removed and a dielectric layer may be deposited on the substrate, thereby insulating the remaining portions of the substrate from the materials to be deposited during formation of the gate. The dielectric layer may include, for example, a material with a high dielectric constant, such as hafnium oxide ($HfO_2$).

In some embodiments, the gate of the semiconductor device and a local interconnect may be formed during a same process step of an integrated circuit fabrication process. In some embodiments, forming a local interconnect from a gate material and during a gate-formation step may reduce the number of process steps required to fabricate the integrated circuit. In some embodiments, the local interconnect may be shorter and/or have lower capacitance than an interconnect with the same endpoints that is routed through through-vias and an upper interconnect layer.

FIG. 5D shows a flowchart of a method of forming a gate of a semiconductor device, according to some embodiments. In step 532 of FIG. 5D, one or more gate materials are provided over the substrate (e.g., on a dielectric layer). In some embodiments, the provided gate material(s) may include a work-function material (e.g., a metal carbide such as titanium carbide or a metal nitride such as titanium nitride) and a metallic material (e.g., aluminum, tungsten, and/or copper). In some embodiments, the gate material(s) may be provided by depositing the work-function material on the dielectric layer, removing portions of the work-function layer that were deposited over portions of the substrate corresponding to n-channel FETs, and depositing the metallic material over the work-function material and the exposed portions of the dielectric layer. However, embodiments are not limited in this regard. In some embodiments, any material(s) known to one of ordinary skill in the art or otherwise suitable for functioning as a gate of a semiconductor device (e.g., polysilicon and/or metallic materials) may be provided using techniques known to one of ordinary skill in the art or otherwise suitable for providing such material(s).

In step 534 of FIG. 5D, a mask is aligned over the gate material(s). In some embodiments, protrusions from the surface of the integrated circuit may be used to facilitate alignment of the mask. Such protrusions may correspond, for example, to portions of the substrate that were isolated from each other during step 504 of the method of FIG. 5A (e.g., via contacts, doped regions of semiconductor devices, and/or body regions of semiconductor devices). In some embodiments, the alignment step may include an optical alignment technique in which the scattering of light by the protrusions is used to detect the locations of the protrusions. In some embodiments, the mask may contain openings over portions of the substrate corresponding to semiconductor devices gates and/or portions of the substrate corresponding to electrical interconnects, including but not limited to interconnects that are coupled to the gates of the semiconductor devices. In embodiments where a via contact and a doped region of a semiconductor device are defined in a same processing step, the use of the protrusion corresponding to the via contact as a mask-alignment reference may facilitate alignment of the mask with respect to the elements of the semiconductor device, such as a drain, source, gate, and/or fin.

In step 536 of FIG. 5D, portions of the gate material(s) which do not correspond to a gate of the semiconductor device and/or to an electrical interconnect are removed. In some embodiments, the process of removing the gate material(s) may include patterning the top layer of gate material(s) through openings in the mask, removing the mask, and etching the gate material(s). In some embodiments, the etching may be plasma etching, reactive ion etching, or low temperature $Cl_2/H_2$ or florin metal etch. Embodiments are not limited in this regard. In some embodiments, any technique known to one of ordinary skill in the art or otherwise suitable for selectively removing the gate material(s) may be used.

The method illustrated in FIG. 5D is just one example of a method of forming a gate of a semiconductor device. In some embodiments, techniques known to one of ordinary skill in the art or otherwise suitable for gate formation may be used.

In step 508 of FIG. 5A, other layers of the integrated circuit are formed. For example, in some embodiments, a contact oxide film may be deposited and polished to a desired thickness (e.g., by chemical-mechanical polishing), portions of the integrated circuit corresponding to through-vias and/or interconnect layers may be opened (e.g., using a Damascene process), via contacts may be silicided, through-via openings and/or interconnect layer openings may be filled with suitable liner materials (e.g., tantalum nitride or titanium nitride) and/or metallic materials (e.g., tungsten, aluminum, or copper), and chemical-mechanical polishing may be performed. In some embodiments interconnect layers (e.g., metal interconnect layers) may be formed above the semiconductor devices and coupled to the semiconductor devices by the through-vias. Embodiments are not limited in this regard. In some embodiments, the remaining portions of the integrated circuit may be fabricated using techniques known to one of ordinary skill in the art or any other suitable techniques for fabricating an integrated circuit.

In some embodiments, steps of the method of FIG. 5A may be performed in the order illustrated in FIG. 5A or in some other order. For example, in some embodiments, isolation step 504 and/or gate-formation step 506 may be performed before doping step 502. Some embodiments may include only a subset of the method steps illustrated in FIG. 5A. For example, some embodiments may include only steps 502, 504, and 506.

Figure 6:
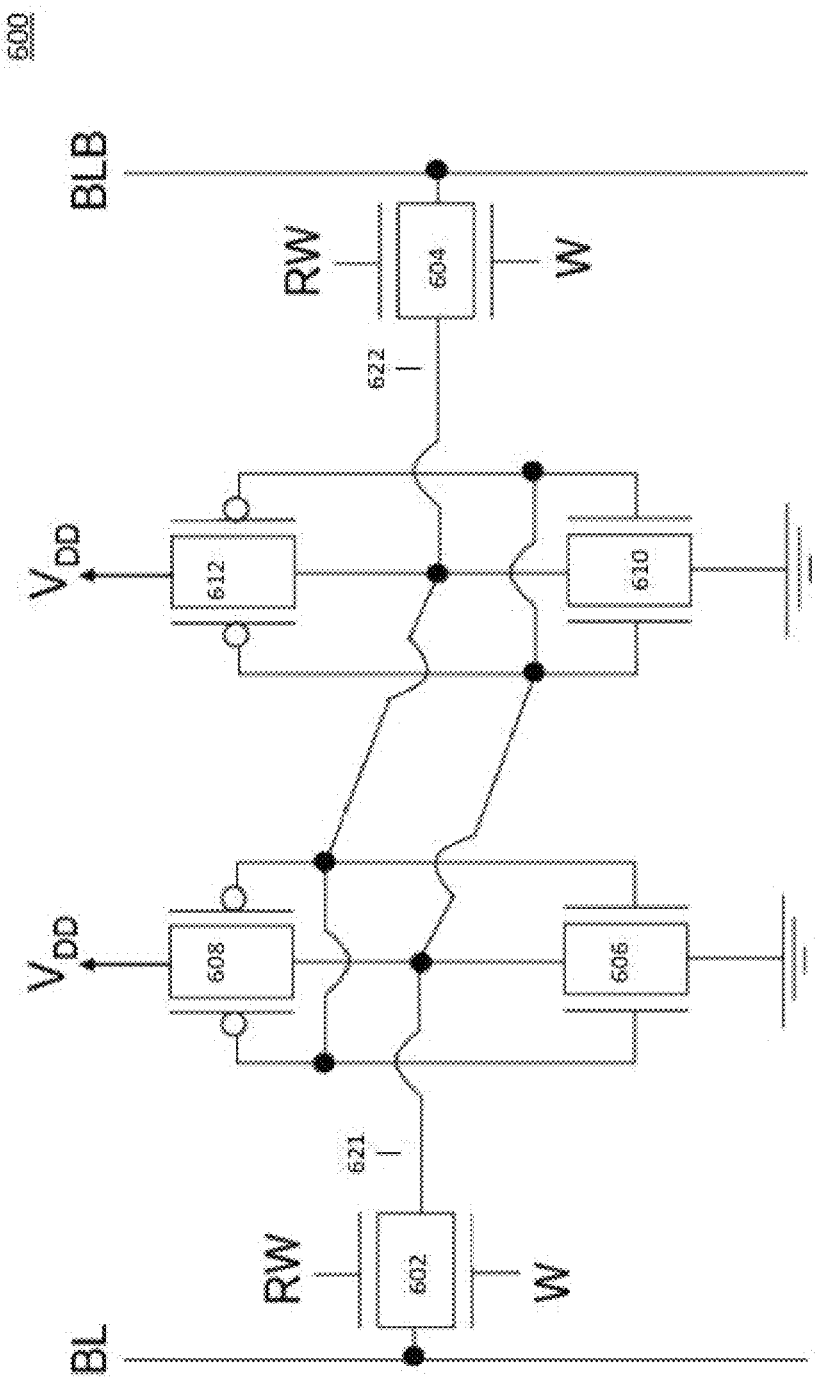
FIG. 6 shows a schematic of an SRAM cell, according to some embodiments.

Embodiments of the method of FIG. 5A may be used, for example, to fabricate a memory device or a portion of a memory device, such as a memory cell. In some embodiments the method of FIG. 5A may be used to fabricate an SRAM (static random access memory) cell, such as SRAM cell 600 of FIG. 6. FIG. 6 shows a schematic of an SRAM cell, according to some embodiments. The SRAM cell of FIG. 6 includes six finFETs 602, 604, 606, 608, 610, and 612. In some embodiments, finFETs 602, 604, 606, and 610 may be n-channel finFETs, and finFETs 608 and 612 may be p-channel finFETs. FinFETs 602 and 604 are independent-gate (IG) finFETs, each having one gate coupled to a write line (W) and one gate coupled to a read/write line (RW). FinFETs 606, 608, 610, and 612 are dependent-gate finFETs or tied-gate finFETs (e.g., independent-gate finFETs in which the independent gates are coupled to each other).

In some embodiments, each of the SRAM cell's finFETs may have a single fin with a height of 32 nm, a width of 8 nm, and a channel length of 32 nm. However, embodiments are not limited in this regard. In some embodiments, each finFET's configuration (e.g., number of fins, type of gate, fin dimensions, etc.) may be a configuration known to one of ordinary skill in the art or otherwise suitable for a finFET of an SRAM cell.

The operation of an embodiment of the SRAM cell illustrated in FIG. 6 is described by Liu et al. in "An Independent-Gate FinFET SRAM Cell for High Data Stability and Enhanced Integration Density," in Proceedings of the 20th International IEEE SoC (System on Chip) Conference, 2007. FinFETs 608 and 606 form an inverter which is cross coupled with a second inverter formed by finFETs 610 and 612. The cross-coupled inverters store a binary value at node 621 and the inverse of that binary value at node 622. FinFETs 602-604 control access to the SRAM cell. Setting write line (W) and read/write line (RW) low disconnects the cross-coupled inverters from bit lines BL and BLB. The SRAM cell is read by setting read/write line (RW) high while holding write line (W) low, which causes bit line BL to read out the binary value stored at node 621 (i.e., the output of the inverter formed by finFETs 606 and 608). The SRAM cell is written by setting read/write line (RW) and write line (W) high, which causes the value of the bit provided on bit line BL to be stored at node 621. In some embodiments, access lines of the SRAM may include bit lines BL and BLB. In some embodiments, control lines of the SRAM may include write line W and read/write line RW.

Figure 7:
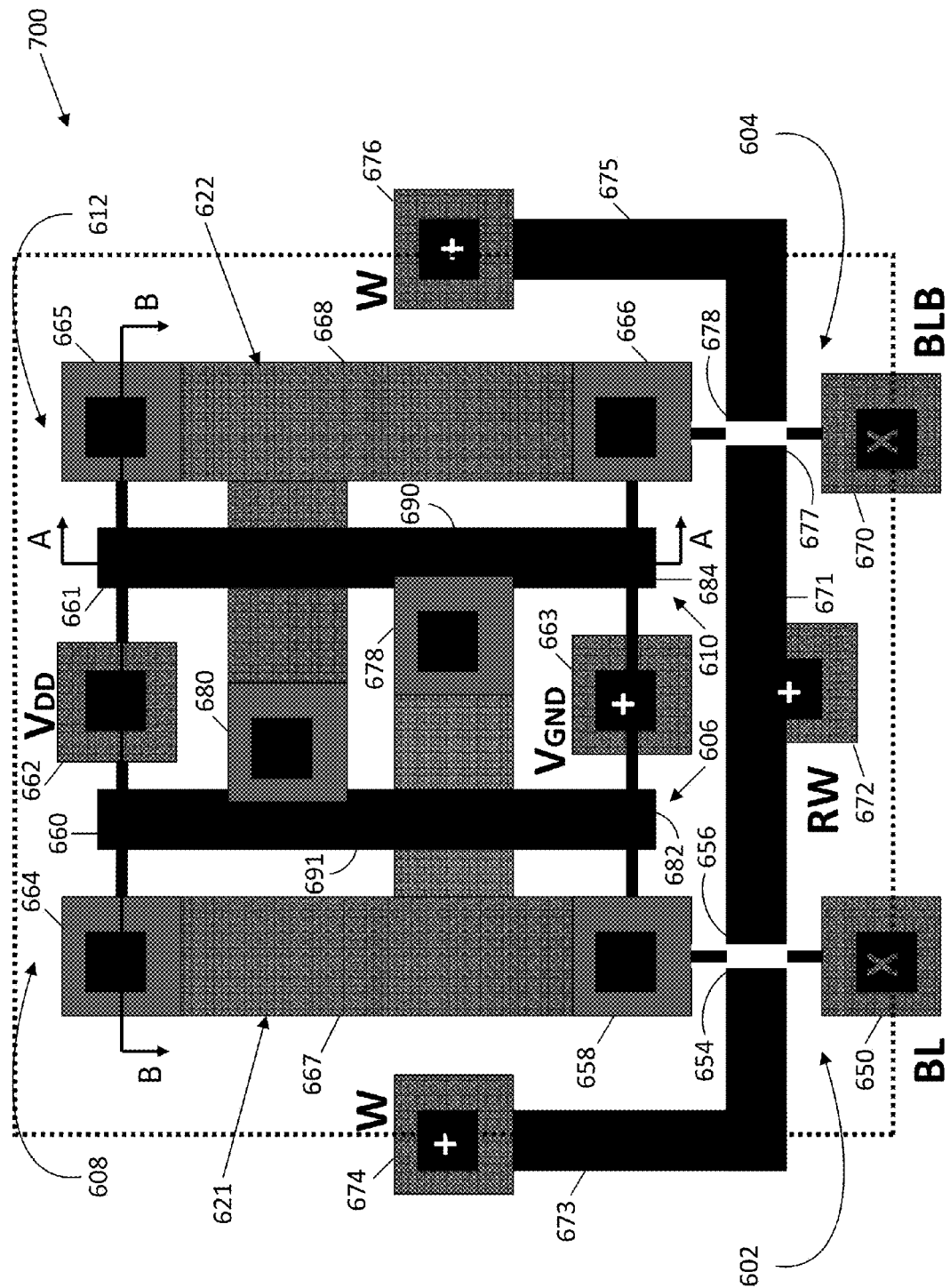
FIG. 7 shows an integrated circuit layout of the SRAM cell of FIG. 6, according to some embodiments.

FIG. 7 shows SRAM cell of FIG. 6 laid out on an integrated circuit 700, according to some embodiments. As can be seen, gates 660 and 682 of finFET 608 and finFET 606, respectively, are connected by a local interconnect 691. Likewise, gates 661 and 684 of finFET 610 and finFET 612, respectively, are connected by local interconnect 690. FinFETs 608 and 612 share a drain 662 which is coupled to a supply voltage VDD through a via contact and an interconnect layer. Likewise, finFETs 606 and 610 share a source 663 which is coupled to ground through a via contact and an interconnect layer. The source 664 of finFET 608 and the drain 658 of finFET 606 are connected through via contacts and an interconnect layer 667, which is also connected to local interconnect 690 through via contact 678. The source 665 of finFET 612 and the drain 666 of finFET 610 are connected through via contacts and interconnect layer 668, which is also connected to local interconnect 691 through via contact 680. The source 650 of finFET 602 is coupled to bit line BL through a via contact and an interconnect layer. The source 670 of finFET 604 is coupled to bit line BLB through a via contact an interconnect layer. Each of finFETs 602 and 604 has a gate (656 and 677, respectively) connected to read/write line (RW) through a local interconnect 671, a via contact 672, and an interconnect layer. FinFET 602 has a second gate 654 connected to write line (W) through a local interconnect 673, a via contact 674, and an interconnect layer. Likewise, finFET 604 has a second gate 678 connected to a write line (W) through a local interconnect 675, a via contact 676, and an interconnect layer.

In some embodiments, the finFET gates and local interconnects may be formed from polysilicon and/or one or more metallic materials. In some embodiments, the local interconnects may be formed in the same processing step and with the same materials (or a subset of the same materials) as the gates of the finFETs. In some embodiments, at least some of the materials used to form the gates of the finFETs may be metallic materials. In some embodiments, the interconnect layers coupled to various nodes of the SRAM cell may be metal interconnect layers.

Embodiments of the method of FIG. 5A may be used to fabricate the SRAM cell of FIG. 6 (e.g., using the layout of FIG. 7). FIGS. 8A-13C show embodiments of integrated circuit 700 at different times during fabrication according to an embodiment of the method of FIG. 5A. In FIGS. 8A-13C, reference numbers between 600 and 799 are used to identify structural elements of the SRAM cell (e.g., finFET doped regions, finFET fins, finFET gates, via contacts, etc.), while reference numbers between 800 and 899 are used to identify materials that form the structures and materials used during the fabrication of the structures (e.g., masks, silicon layers, dielectric layers, etc.).

Figure 8A:
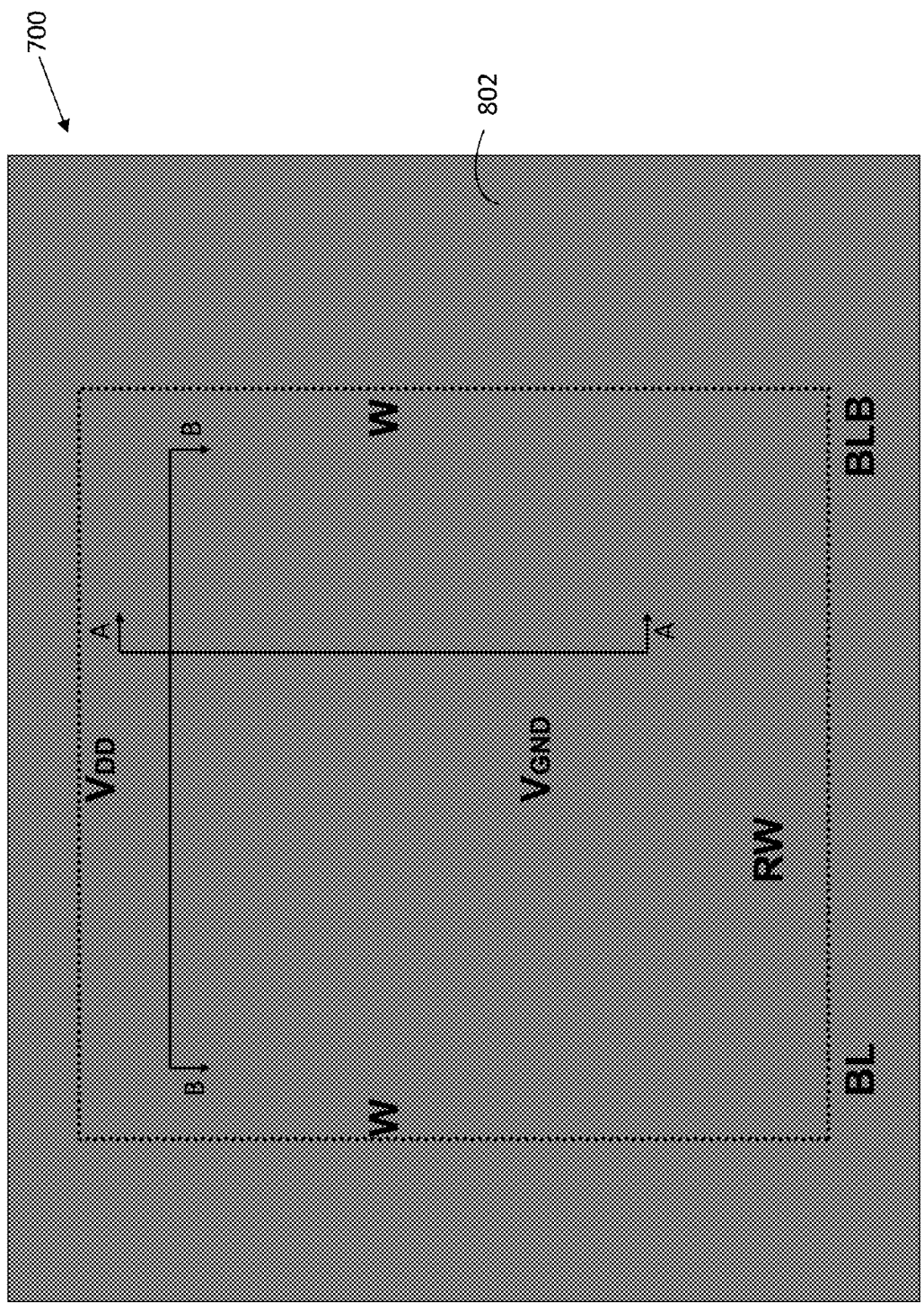
FIGS. 8A-8C show integrated circuit 700 after mask-provision sub-step 512 has been performed (in particular, FIGS. 8A, 8B, and 8C show a top view of integrated circuit 700, a cross-sectional view of integrated circuit 700 along line A-A, and a cross-sectional view of integrated circuit 700 along line B-B, respectively), according to some embodiments.
Figure 8B:
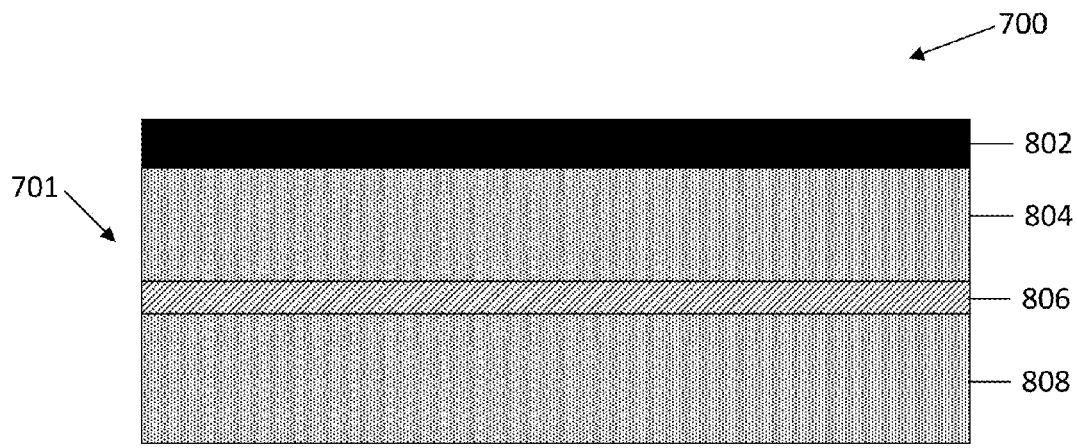
Figure 8C:
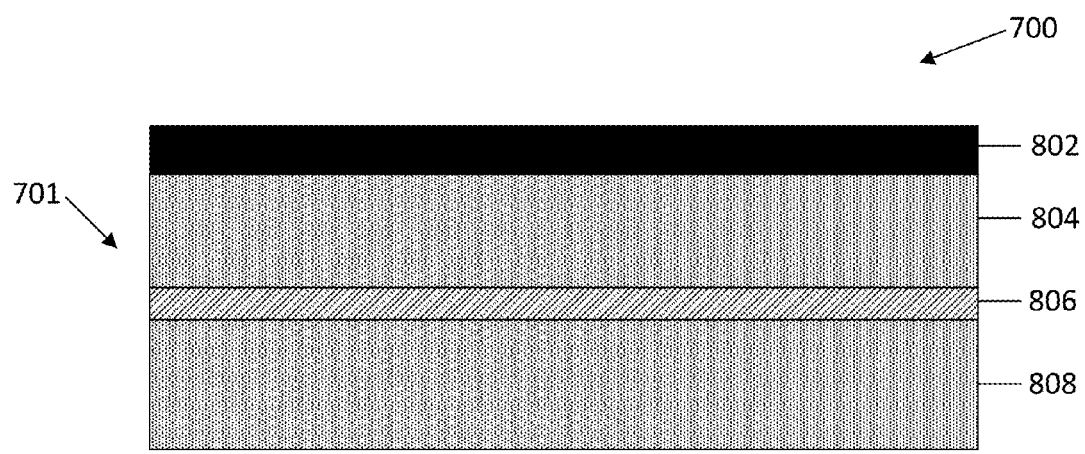

As described above, in the method of FIG. 5A, portions of a semiconductor substrate may be doped (step 502). In a sub-step of the doping step (e.g., step 512 of FIG. 5B), a mask may be provided over a semiconductor substrate. FIGS. 8A-C show integrated circuit 700 after mask-provision sub-step 512 has been performed, according to some embodiments. In particular, FIGS. 8A, 8B, and 8C show a top view of integrated circuit 700, a cross-sectional view of integrated circuit 700 along line A-A, and a cross-sectional view of integrated circuit 700 along line B-B, respectively, according to some embodiments.

In the example of FIGS. 8A-C, integrated circuit 700 includes substrate 701 and a mask 802. Substrate 701 may be any semiconductor substrate known to one of ordinary skill in the art or otherwise suitable for fabricating an SRAM cell, including but not limited to a fully-depleted silicon-on-insulator (FDSOI) substrate with a silicon layer 804, a buried oxide (BOX) layer 806, and a second silicon layer 808. In some embodiments, silicon layer 804 may have a thickness of 32 nm or less. In some embodiments, BOX layer 806 may have a thickness between 10 nm and 50 nm. Mask 802 may include any material known to one of ordinary skill in the art or otherwise suitable for masking a substrate 701, including but not limited to silicon nitride (SiN) or silicon oxide (SiO).

Figure 9A:
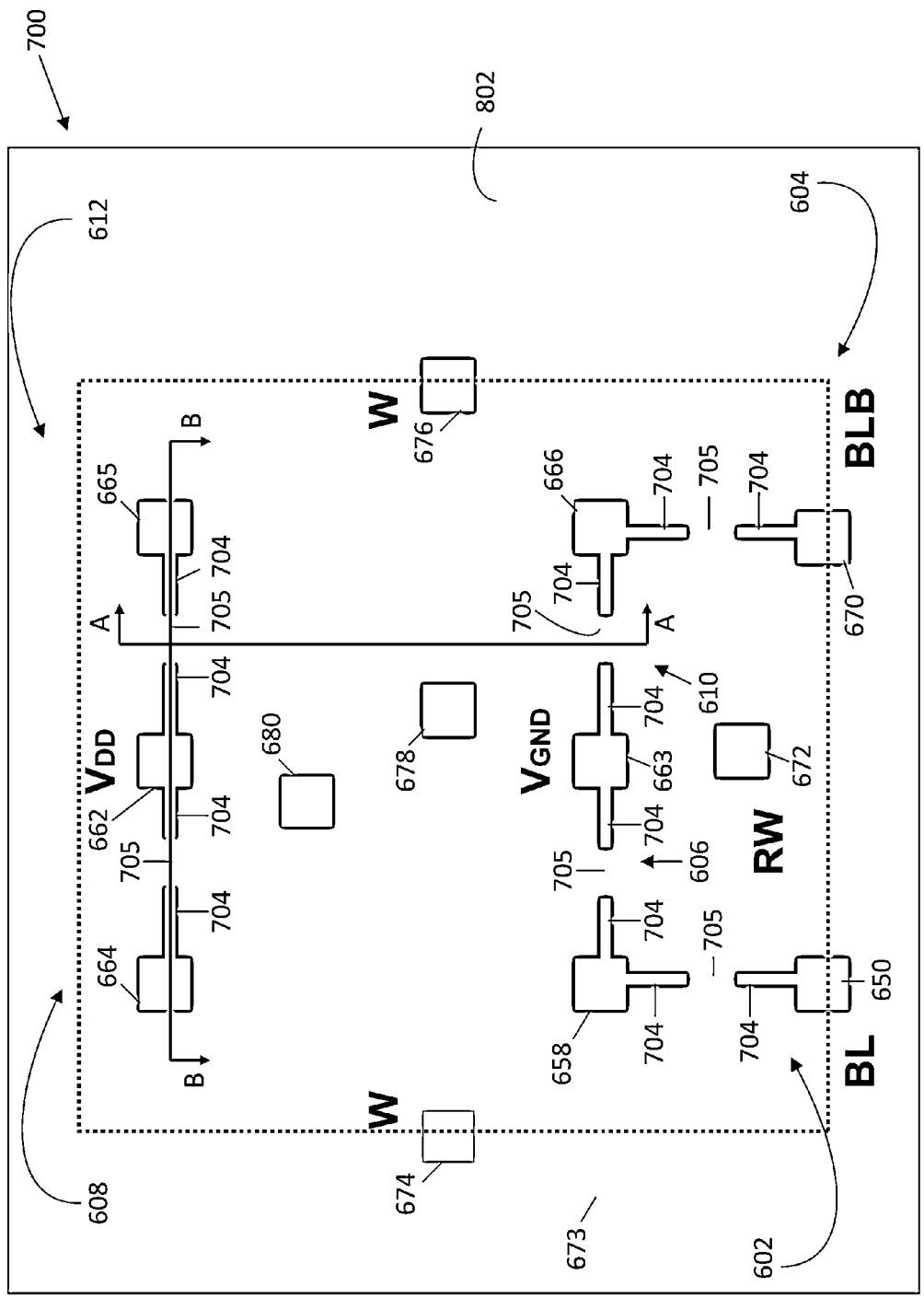
FIGS. 9A-C show integrated circuit 700 after mask-opening sub-step 514 and implantation/activation sub-step 516 have been performed (in particular, FIGS. 9A, 9B, and 9C show a top view of integrated circuit 700, a cross-sectional view of integrated circuit 700 along line A-A, and a cross-sectional view of integrated circuit 700 along line B-B, respectively), according to some embodiments.
Figure 9B:
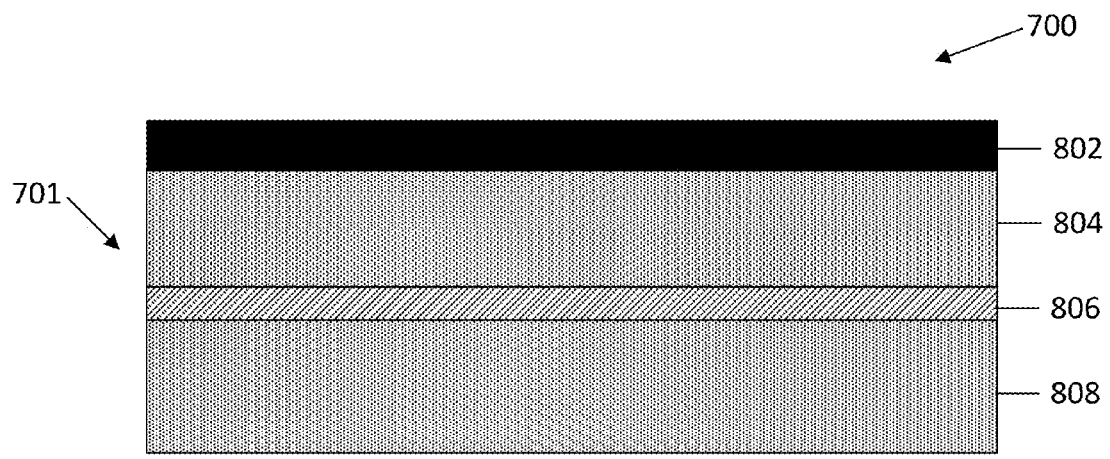
Figure 9C:
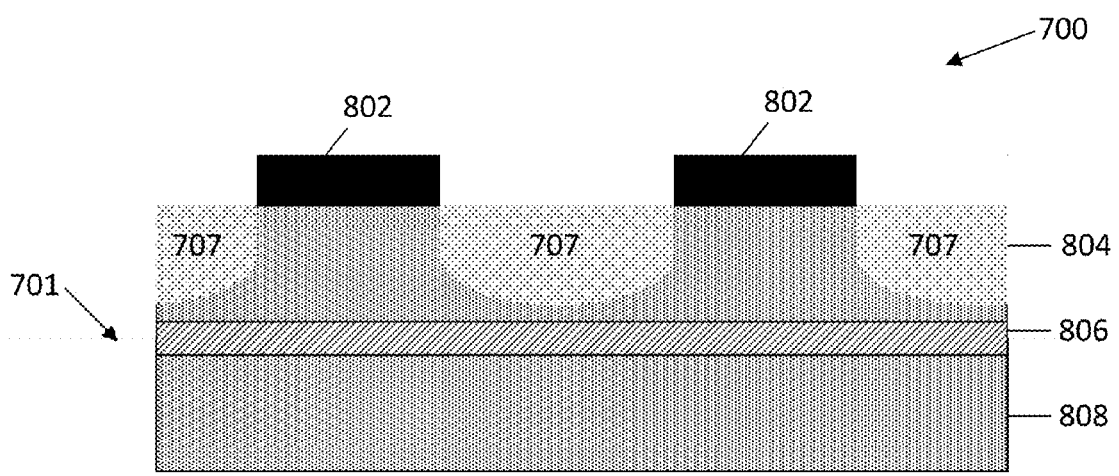

In additional sub-steps of the doping step (e.g., steps 514 and 516 of FIG. 5B), portions of the mask may be opened, portions of the substrate accessible through the openings in the mask may be implanted with dopants, and the implanted dopants may be activated. FIGS. 9A-C show integrated circuit 700 after mask-opening sub-step 514 and implantation-activation sub-step 516 have been performed, according to some embodiments. In particular, FIGS. 9A, 9B, and 9C show a top view of integrated circuit 700, a cross-sectional view of integrated circuit 700 along line A-A, and a cross-sectional view of integrated circuit 700 along line B-B, respectively, according to some embodiments.

In the example of FIGS. 9A-C, mask 802 includes eight openings over portions of substrate 701 which correspond to the doped regions (650, 658, 662, 663, 664, 665, 666, 670) of the six finFETs; five openings over portions of substrate 701 which correspond to via contacts (672, 674, 676, 678, and 680); and twelve openings which correspond to non-body regions (704) of the fins of the six finFETs. Mask 802 does not include openings over the portions of the substrate that correspond to the body regions of the six finFETs (705). As can be seen in FIG. 9C, the portions of substrate 701 accessible through the openings in mask 802 are doped to form doped regions 707. In some embodiments, different dopants may be used for the doped regions of the p-channel finFETs (i.e., finFETs 608 and 612) and the n-channel finFETs (i.e., finFETs 602, 604, 606, and 610). In some embodiments, the portions of the substrate corresponding to the bodies (705) of the finFETs may be partially or fully depleted of charge carriers.

Forming the finFET doped regions and the via contacts in the same processing step(s) may facilitate alignment of the finFET terminals with the SRAM cell's access lines (e.g., write line W, read/write line RW, and/or bit lines BL and BLB).

Figure 10A:
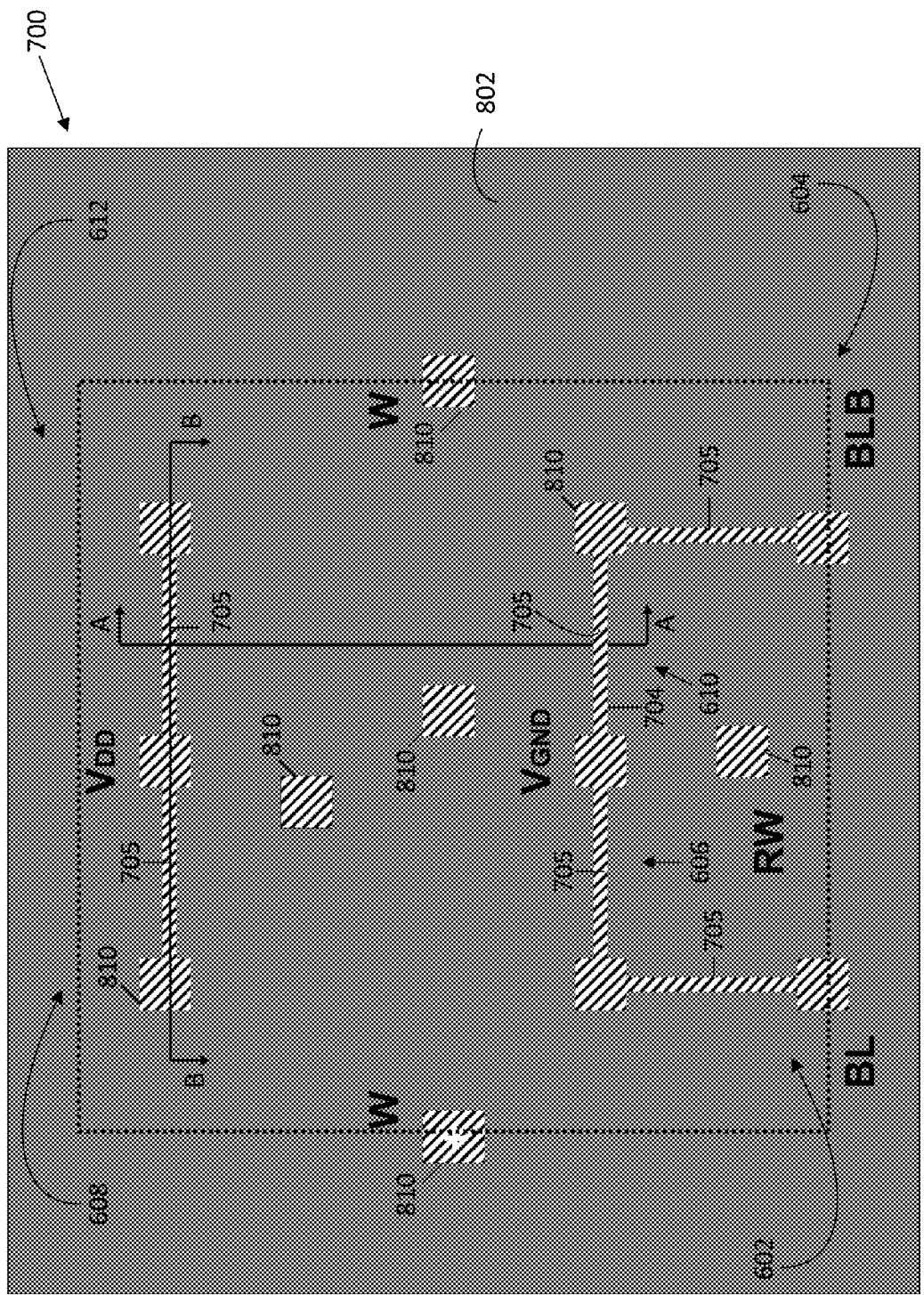
FIGS. 10A-C show integrated circuit 700 after mask-opening sub-step 522 and inverse-mask sub-step 524 have been performed (in particular, FIGS. 10A, 10B, and 10C show a top view of integrated circuit 700, a cross-sectional view of integrated circuit 700 along line A-A, and a cross-sectional view of integrated circuit 700 along line B-B, respectively), according to some embodiments.
Figure 10B:
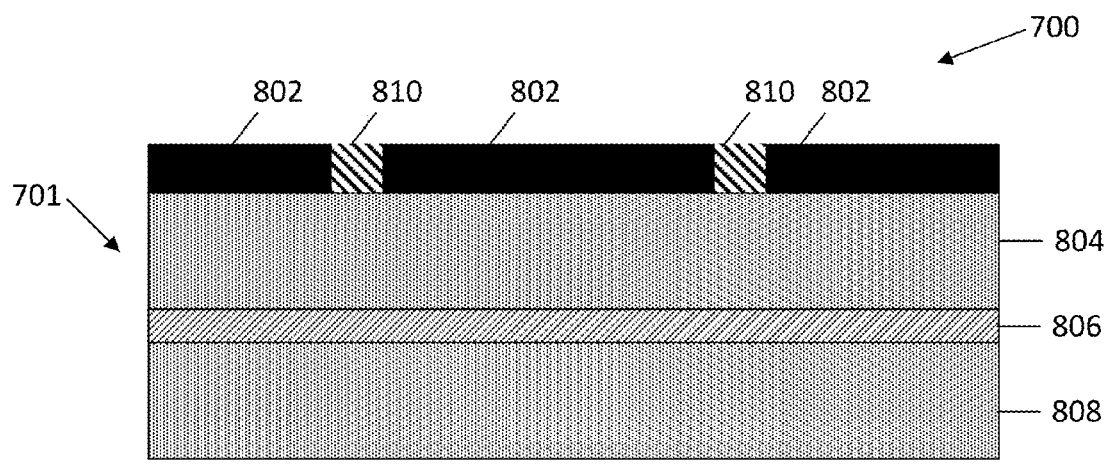
Figure 10C:
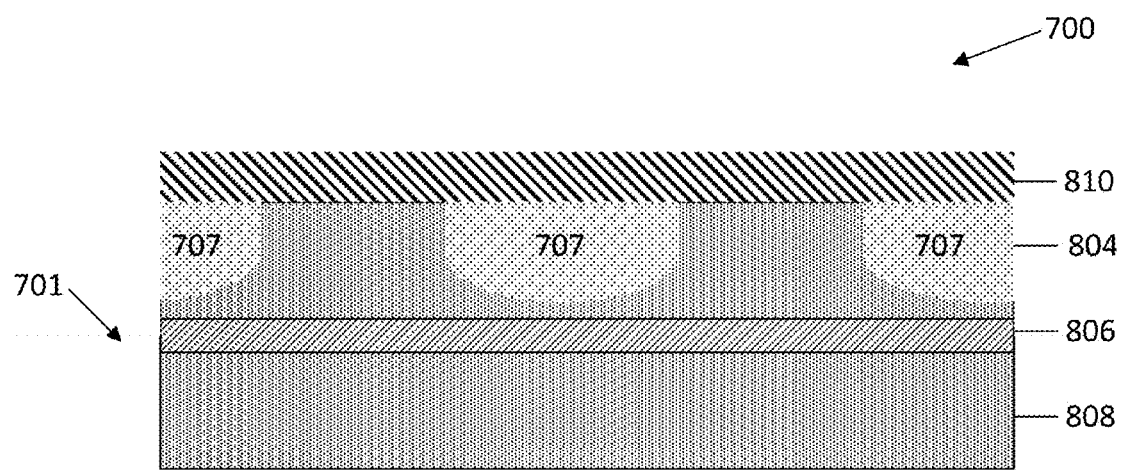

In the method of FIG. 5A, doped regions of semiconductor devices (e.g., finFETs) may be isolated from each other (step 504). In a sub-step of the isolation step (e.g., steps 522 and 524 of FIG. 5C), portions of a mask may be opened over portions of the substrate corresponding to the body regions of the semiconductor devices (e.g., finFETs), and an inverse mask may be formed in the openings of the first mask. FIGS. 10A-C show integrated circuit 700 after mask-opening sub-step 522 and inverse-mask sub-step 524 have been performed on integrated circuit 700, according to some embodiments. In particular, FIGS. 10A, 10B, and 10C show a top view of integrated circuit 700, a cross-sectional view of integrated circuit 700 along line A-A, and a cross-sectional view of integrated circuit 700 along line B-B, respectively, according to some embodiments.

In the example of FIGS. 10A-C, the mask 802 includes the openings described above with respect to FIGS. 9A-C, and additional openings above the portions of the substrate corresponding to the bodies of the six finFETs (705). In the example of FIGS. 10A-C, the openings in mask 802 are filled with a second mask material 810 which forms a mask that is an inverse of mask 802 (an "inverse mask"). In some embodiments, inverse mask 810 may be formed from a material that differs from the material of mask 802. For example, in embodiments where mask 802 comprises silicon nitride (SiN), inverse mask 810 may comprise silicon oxide (SiO). As another example, in embodiments where mask 802 comprises silicon oxide (SiO), inverse 810 mask may comprise silicon nitride (SiN).

Figure 11A:
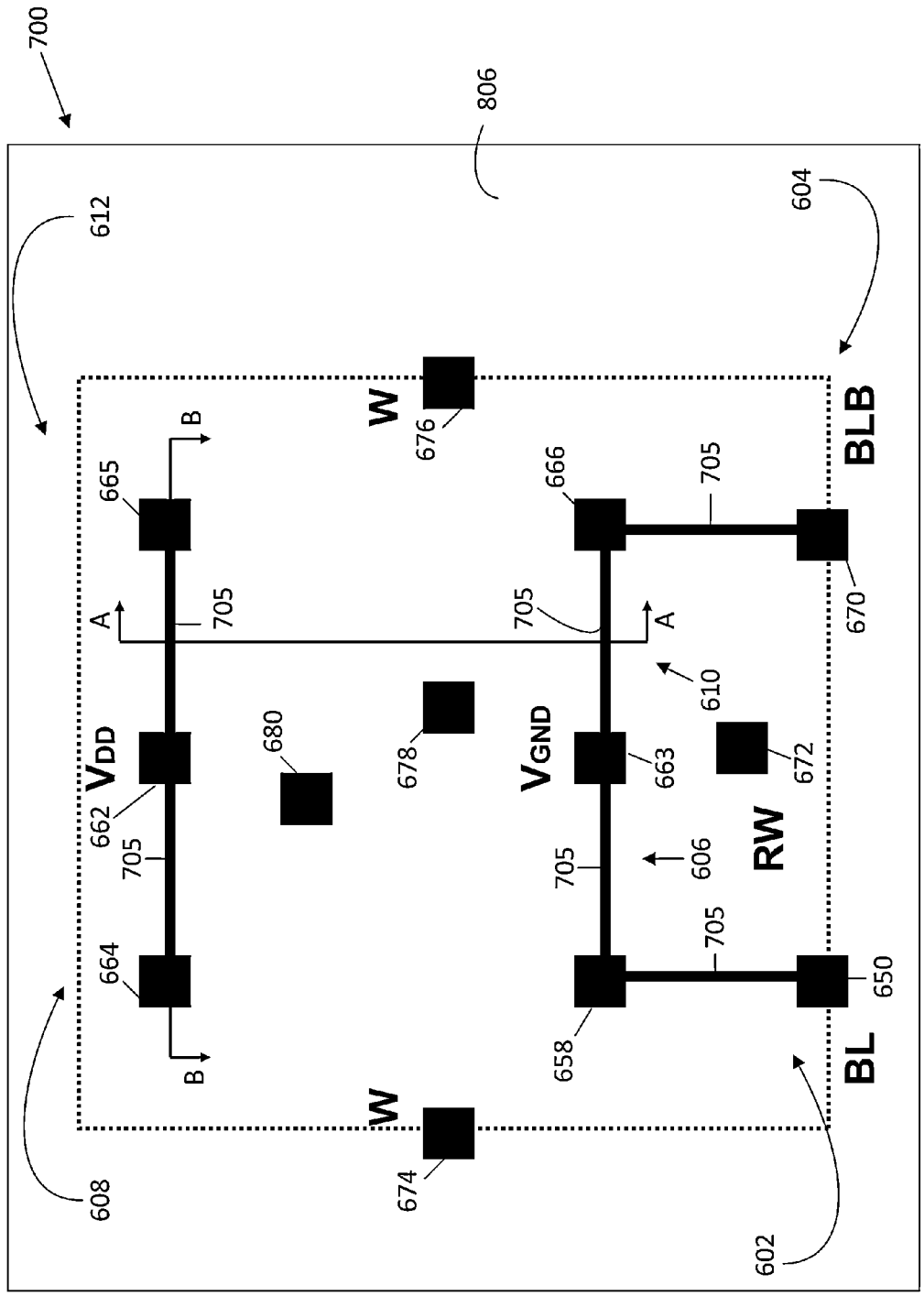
FIGS. 11A-C show integrated circuit 700 after mask-removal sub-step 526 and substrate-removal sub-step 528 have been performed (in particular, FIGS. 11A, 11B, and 11C show a top view of integrated circuit 700, a cross-sectional view of integrated circuit 700 along line A-A, and a cross-sectional view of integrated circuit 700 along line B-B, respectively), according to some embodiments.
Figure 11B:
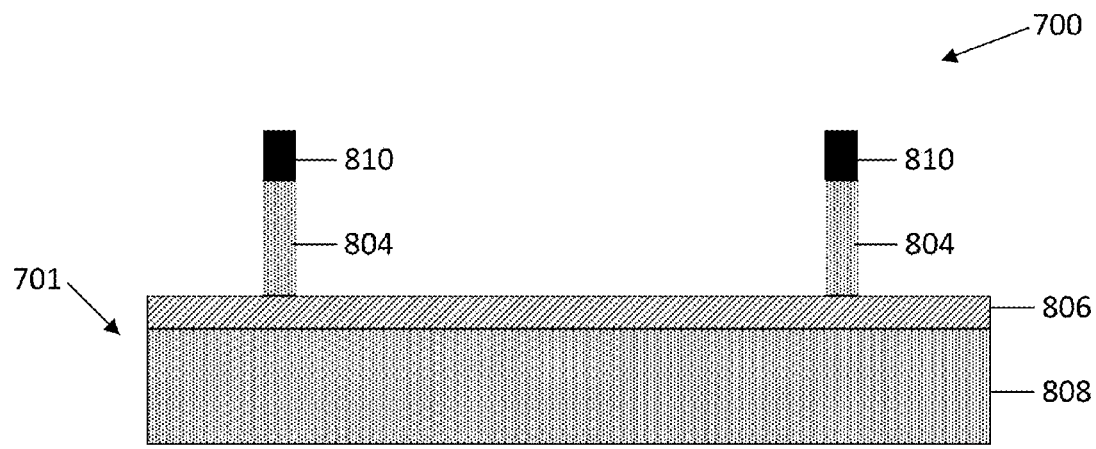
Figure 11C:
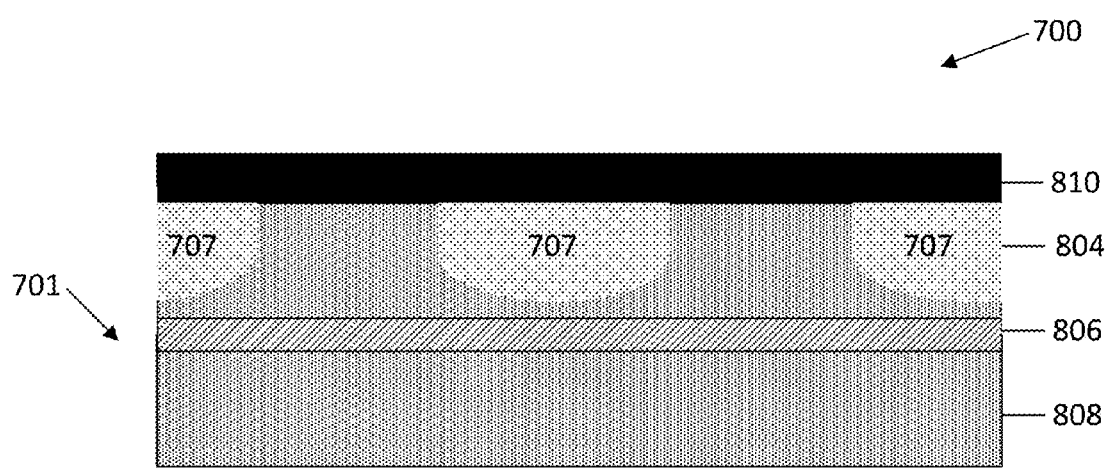

In additional sub-steps of the doping step (e.g., steps 526 and 528 of FIG. 5B), the first mask and portions of the substrate which are not covered by the inverse mask may be removed. FIGS. 11A-C show integrated circuit 700 after mask-removal sub-step 526 and substrate-removal sub-step 528 have been performed, according to some embodiments. In particular, FIGS. 11A, 11B, and 11C show a top view of integrated circuit 700, a cross-sectional view of integrated circuit 700 along line A-A, and a cross-sectional view of integrated circuit 700 along line B-B, respectively, according to some embodiments.

In the example of FIGS. 11A-C, integrated circuit 700 includes inverse mask 810 and the portions of substrate layer 804 covered by the inverse mask, which form the doped regions (650, 658, 662, 663, 664, 665, 666, 670) and bodies (705) of the six finFETs, and the doped regions of the five via contacts (672, 674, 676, 678, and 680). All other portions of substrate layer 804 within the SRAM cell have been removed, thereby isolating the finFETs and exposing the surface of buried oxide (BOX) layer 806.

Figure 11D:
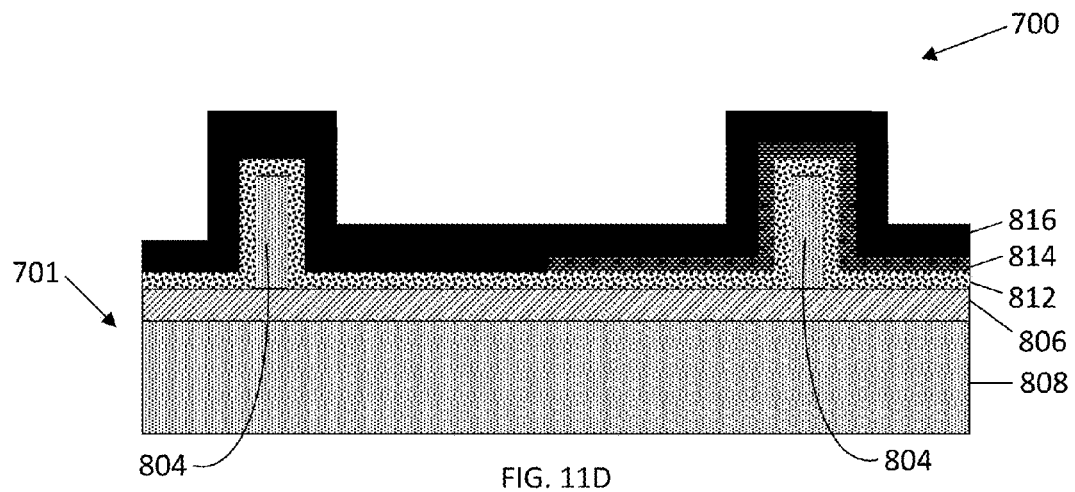
FIGS. 11D-E show integrated circuit 700 after dielectric layer 812 and gate materials 814 and 816 have been provided (in particular, FIGS. 11D and 11E show a cross-sectional view of integrated circuit 700 along line A-A and a cross-sectional view of integrated circuit 700 along line B-B, respectively), according to some embodiments.
Figure 11E:
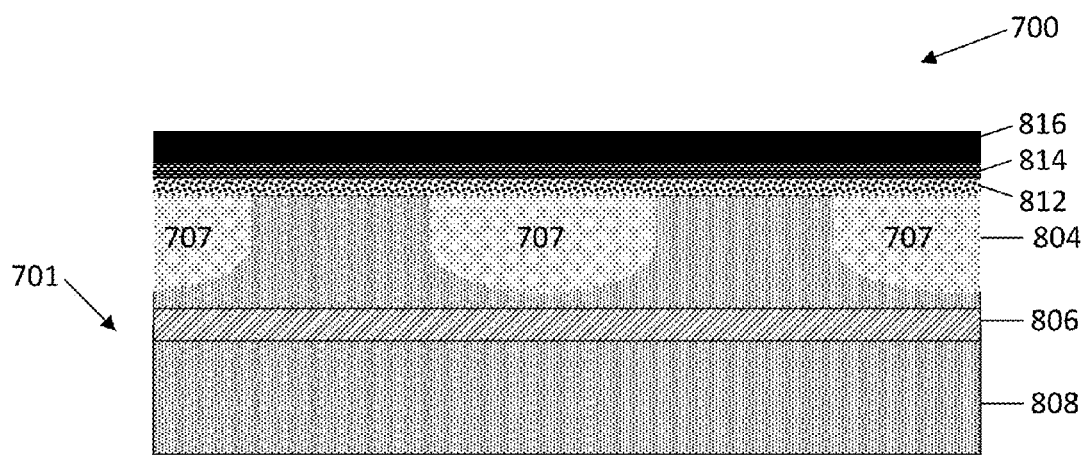

In the method of FIG. 5A, gates of semiconductor devices (e.g., finFETs) are formed (step 506). As part of the gate-formation step, a dielectric layer may be provided on the integrated circuit. As another part of the gate-formation step (e.g., step 532 of FIG. 5D), one or more gate materials may be provided over the dielectric layer. FIGS. 11D and 11E show integrated circuit 700 after dielectric layer 812 and gate materials 814 and 816 have been provided on the integrated circuit, according to some embodiments. In particular, FIGS. 11D and 11E show a cross-sectional view of integrated circuit 700 along line A-A and a cross-sectional view of integrated circuit 700 along line B-B, respectively, according to some embodiments.

In the example of FIGS. 11D-E, integrated circuit 700 includes dielectric layer 812, gate material 814, and gate material 816. In some embodiments, dielectric layer 812 may include a high-k material, such as hafnium oxide ($HfO_2$). In some embodiments, dielectric layer 812 may be provided over substrate 701 throughout the SRAM cell. In some embodiments, gate material 814 may be a work-function material, such as a metal carbide (e.g., TiC) or a metal nitride (e.g., TiN). In some embodiments, gate material 814 may be provided over dielectric layer 812 in portions of the SRAM cell that correspond to p-channel finFETs. In some embodiments, gate material 816 may be a metallic material, such as aluminum, tungsten, or copper. In some embodiments, gate material 816 may be provided on integrated circuit 700 throughout the SRAM cell.

Figure 12A:
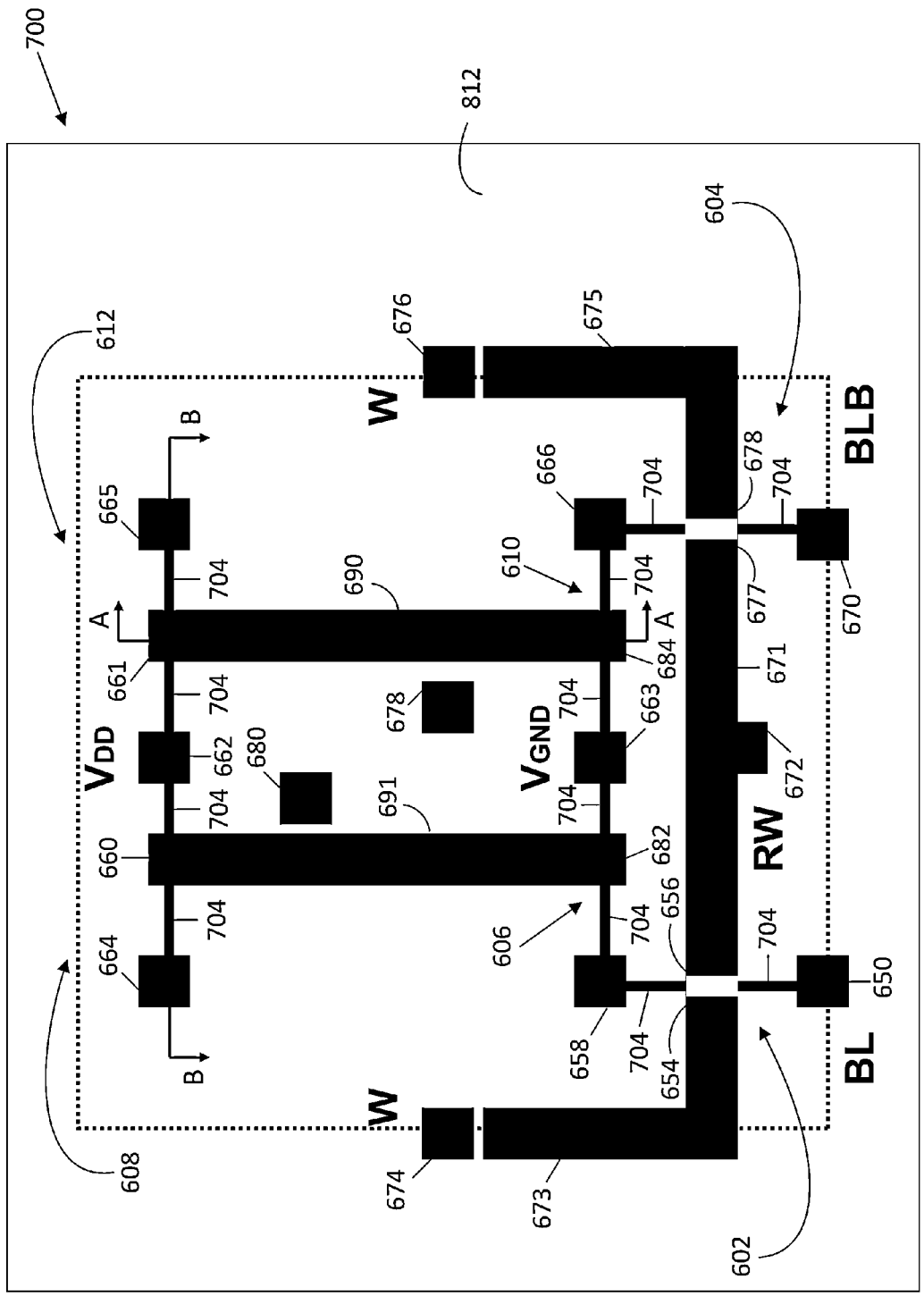
FIGS. 12A-C show integrated circuit 700 after mask-alignment sub-step 534 and material-removal sub-step 536 have been performed (in particular, FIGS. 12A, 12B, and 12C show a top view of integrated circuit 700, a cross-sectional view of integrated circuit 700 along line A-A, and a cross-sectional view of integrated circuit 700 along line B-B, respectively), according to some embodiments.
Figure 12B:
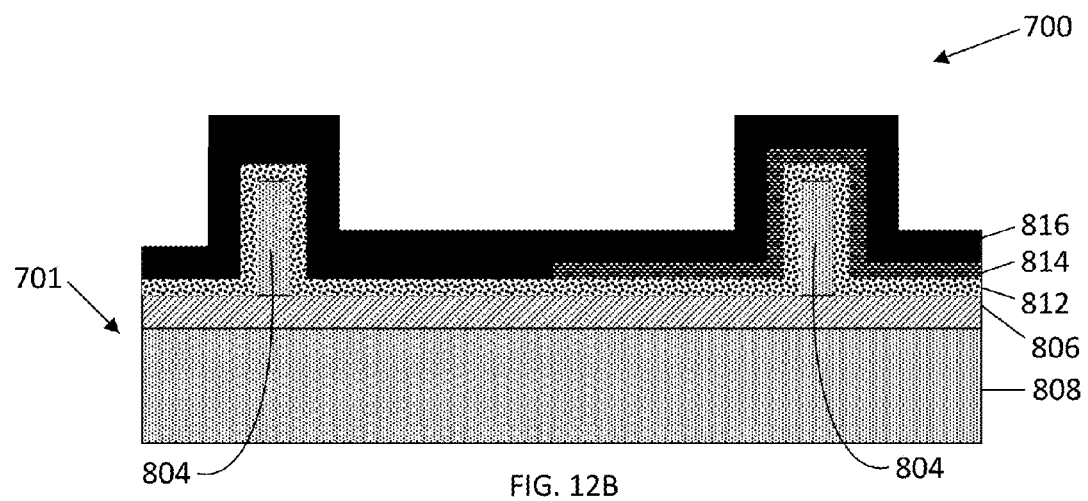
Figure 12C:
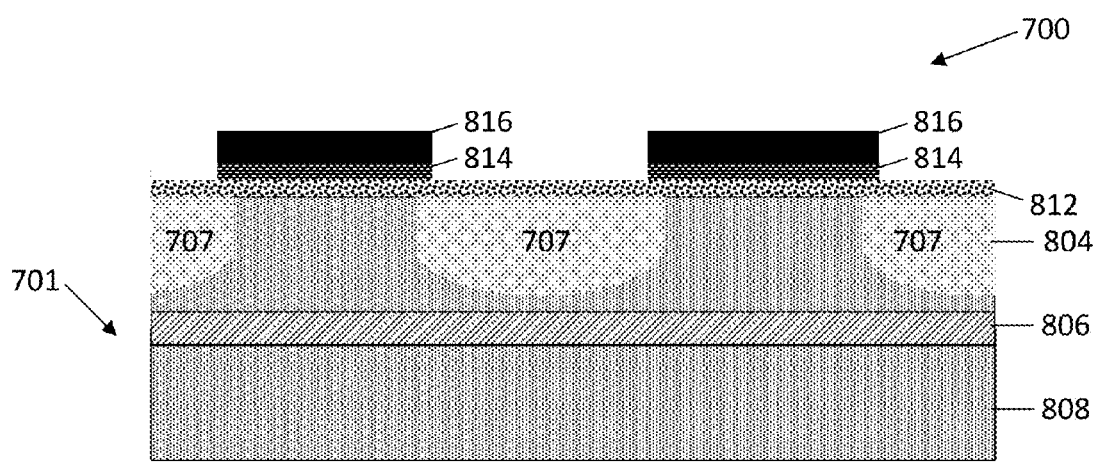

In additional sub-steps of the gate-formation step (e.g., steps 534 and 536 of FIG. 5D), a mask is aligned over the one or more gate materials, and portions of the gate material(s) are removed. FIGS. 12A-C show integrated circuit 700 after mask-alignment sub-step 534 and material-removal sub-step 536 have been performed, according to some embodiments. In particular, FIGS. 12A, 12B, and 12C show a top view of integrated circuit 700, a cross-sectional view of integrated circuit 700 along line A-A, and a cross-sectional view of integrated circuit 700 along line B-B, respectively, according to some embodiments.

In the example of FIGS. 12A-C, the gate material(s) remain on integrated circuit 700 in the local interconnects (671, 673, 675, 690, and 691) and the finFET gates (654/656, 660, 661, 677/678, 682, 684), but have been removed from other portions of the SRAM cell, including the doped regions (650, 658, 662, 663, 664, 665, 666, 670) and bodies (705) of the six finFETs, and the doped regions of the five via contacts (672, 674, 676, 678, and 680). In particular, the gates (660, 661) of the p-channel finFETs (608, 612) include gate material 814 (e.g., a work-function material) and gate layer 816 (e.g., a metallic material), the gates (654/656, 677/678, 682, 684) of the n-channel finFETs (602, 604, 606, 610) include gate material 816, and the local interconnects (671, 673, 675, 690, and 691) include gate material 816. With regards to finFET 602, the independent gates (654 and 656) may be formed by removing the gate material(s) from the middle of the gate area, thereby creating a gap between the gate 654 and gate 656. The same technique may be used to form the independent gates of finFET 604. On portions of the integrated circuit not covered by the gate materials, dielectric layer 812 is exposed. For the reasons described above, using the gate material(s) as local interconnects to couple the finFET gates to each other, to write line W, and/or to read/write line RW may be advantageous, compared to using via contacts and an upper interconnect layer for those purposes.

Figure 13A:
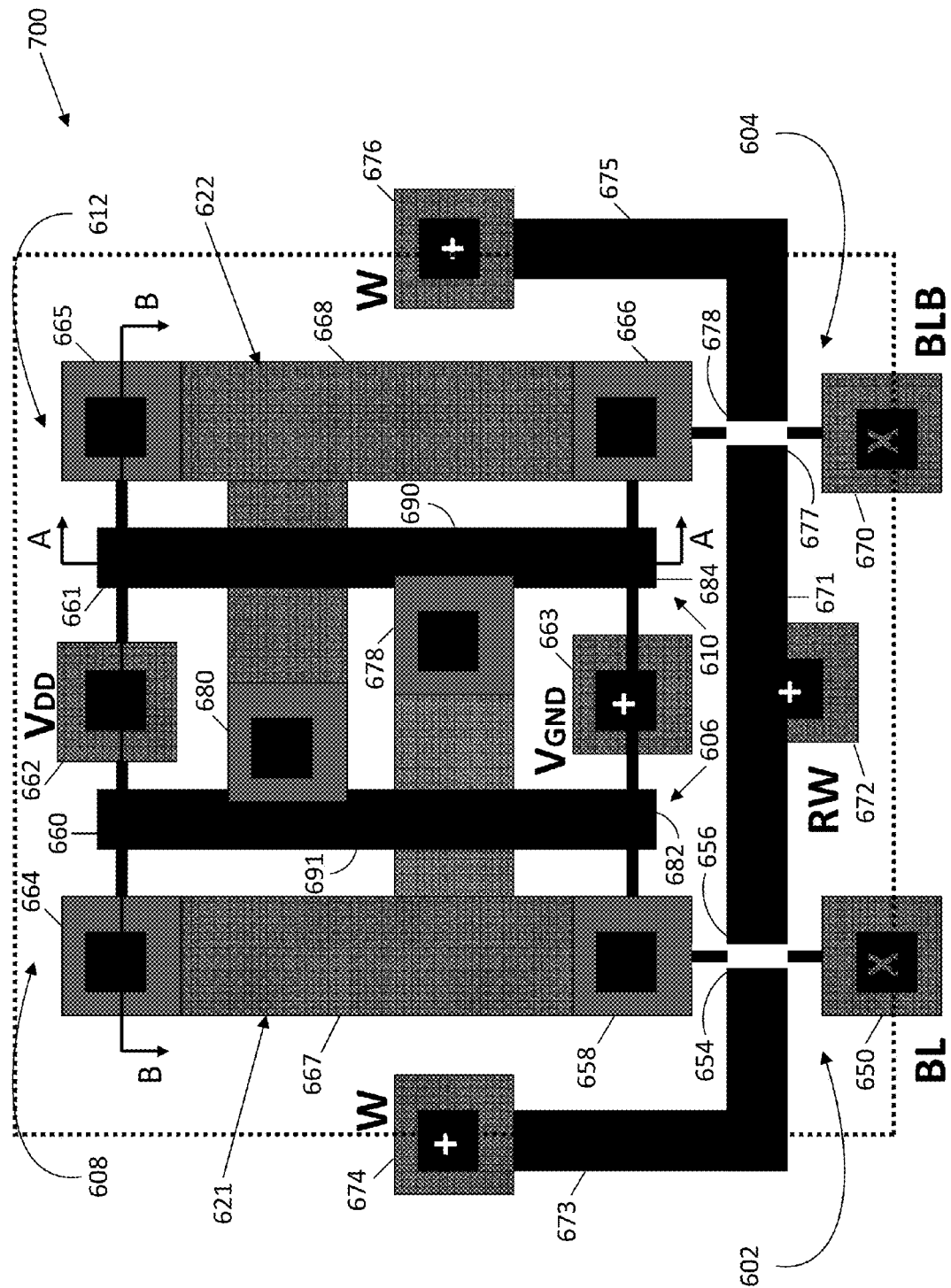
FIGS. 13A-C show integrated circuit 700 after formation of interconnect layers and through vias (in particular, FIGS. 13A, 13B, and 13C show a top view of integrated circuit 700, a cross-sectional view of integrated circuit 700 along line A-A, and a cross-sectional view of integrated circuit 700 along line B-B, respectively), according to some embodiments.
Figure 13B:
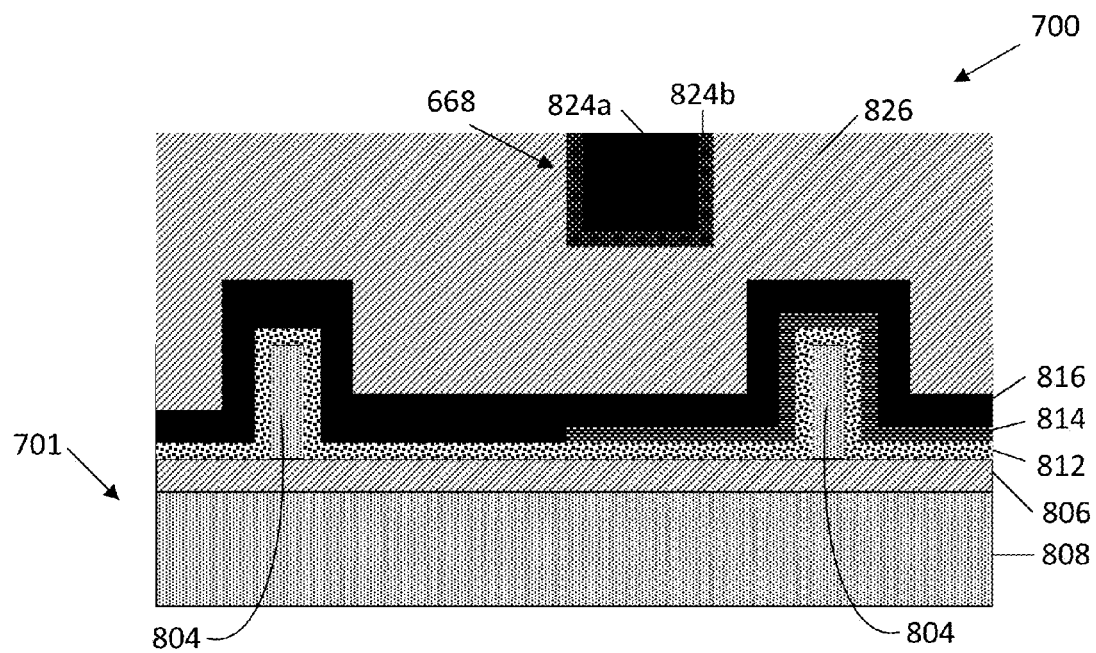
Figure 13C:
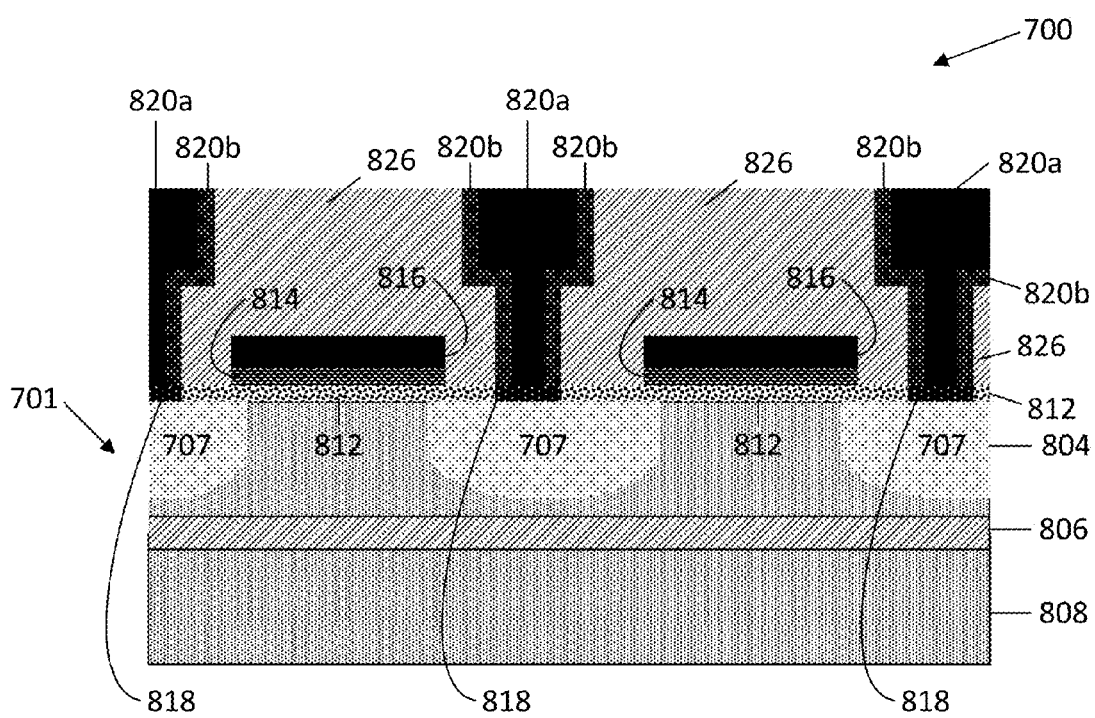

In the method of FIG. 5A, other layers of the integrated circuit are formed (step 508), such as interconnect layers and through-vias. FIGS. 13A-C show integrated circuit 700 after formation of interconnect layers and through-vias. In particular, FIGS. 13A, 13B, and 13C show a top view of integrated circuit 700, a cross-sectional view of integrated circuit 700 along line A-A, and a cross-sectional view of integrated circuit 700 along line B-B, respectively, according to some embodiments.

As can be seen in FIG. 13B, integrated circuit 700 includes a dielectric layer 826 which insulates the components of the SRAM cell from interconnect layer 824. In the example of FIG. 13B, interconnect layer 824 includes two sub-layers, 824a and 824b. In some embodiments, layer 824a of interconnect layer 824 may be a metallic material, such as aluminum, tungsten, copper, or any other metallic or non-metallic material known to one of ordinary skill in the art or otherwise suitable for carrying electrical signals on an integrated circuit. In some embodiments, layer 824b of interconnect layer 824 may be a liner formed from material(s) known to one of ordinary skill in the art or otherwise suitable for lining layer 824a, such as tantalum nitride or titanium nitrde.

As can be seen in FIG. 13C, dielectric layer 826 also insulates the components of the SRAM cell from through-via layer 820. In the example of FIG. 13C, through-via layer 820 includes two sub-layers, 820a and 820b. In some embodiments, layer 820a of through-via layer 820 may be a metallic material, such as aluminum, tungsten, copper, or any other metallic or non-metallic material known to one of ordinary skill in the art or otherwise suitable for carrying electrical signals on an integrated circuit. In some embodiments, layer 820b of through-via layer 820 may be a liner formed from material(s) known to one of ordinary skill in the art or otherwise suitable for lining layer 820a, such as tantalum nitride or titanium nitride. In some embodiments, electrical contacts 818 may connect through-via layers 820 to the doped regions (650, 658, 662-666, 670) of the six finFETs and/or to the doped regions of the via contacts (672, 674, 676, 678, 680). The electrical contacts 818 may include silicides formed on the portions of the doped regions adjacent to the through-vias 820.

Although the foregoing disclosure refers to finFETs as examples of semiconductor devices that may be fabricated using the method of FIG. 5A, embodiments are not limited in this regard. The techniques described herein may be used to fabricate any semiconductor device known to one of ordinary skill in the art, including but not limited to planar, non-planar, three-dimensional, single-gate and/or multi-gate devices, such as diodes, double-gate transistors, finFETs, tri-gate transistors, multi-gate transistors, delta transistors, pi-gate finFETs, omega-gate (Ω-gate) finFETs, gate-all-around finFETs, flexFETs, etc.

Although the foregoing disclosure describes the SRAM cell schematic and layout of FIGS. 6 and 7 as examples of an SRAM cell that may be fabricated using the method of FIG. 5A, embodiments are not limited in this regard. The techniques described herein may be used to fabricate other layouts of the SRAM cell illustrated in FIG. 6, SRAM cells other than the SRAM cell illustrated in FIG. 6, and memory cells other than SRAM cells.

Although the foregoing disclosure describes an SRAM cell as an example of a device that can be fabricated using the method of FIG. 5A, embodiments are not limited in this regard. Embodiments of the method of FIG. 5A may be used to fabricate any memory circuit, processing circuit, or communication circuit known to one of ordinary skill in the art or otherwise suitable for storing, processing, or communicating data.

Terms used herein to describe positioning relationships of structural elements, such as "over," "under," "above," "below," "beside," and "adjacent to," should not be construed as requiring the structural elements to be in contact with each other or directly related (e.g., "over" should not be construed to mean "directly over" or to require that no other structures intervene between structure A and structure B when structure A is described as being "over" structure B), even where some or all embodiments of the structural elements illustrated in the Figures show the structural elements being in contact with each other and/or positioned without any structures intervening between them.

Embodiments described in the present disclosure may be included in (or used to fabricate components of) any electronic or optoelectronic device, including but not limited to a memory, a microprocessor, a mobile electronic device, a mobile phone, a smart phone, a tablet computer, a laptop computer, a desktop computer, a server, a game console, a television, a display, or a communications device.

Terms used herein to describe a doped region of a semiconductor device, such as "source" or "drain," should not be construed to indicate that the doped region is necessarily biased at a lower or higher potential than any other doped region of the semiconductor device.

A portion of an integrated circuit, such as a portion of a semiconductor substrate, "corresponds to" a structure, such as a fin, doped region, or transistor body, if that portion of the integrated circuit forms or will form that structure. Additional forms of correspondence between a portion of an integrated circuit and a structure will be apparent to one of ordinary skill in the art Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:
1. A method, comprising:
doping, in a same processing step, first and second portions of a substrate of an integrated circuit, the first portion corresponding to a doped region of a semiconductor device, and the second portion corresponding to a via contact; and
after the doping, forming the gate of the semiconductor device; and
after the doping, isolating the first portion of the substrate from a third portion of the substrate corresponding to a doped region of a second semiconductor device.

2. The method of claim 1, wherein forming the gate further includes:
forming, from a same metallic layer from which the gate is formed and in a same processing step in which the gate is formed, a local interconnect coupling the gate of the semiconductor device to the second portion of the substrate corresponding to the via contact.

3. The method of claim 1, wherein:
the semiconductor device is a transistor of a cell of a static random-access memory (SRAM), and
a portion of the local interconnect is configured as a portion of a control line of the SRAM.

4. The method of claim 3, wherein the via contact is coupled to an access line or a control line of the SRAM.

5. The method of claim 3, wherein forming the gate of the semiconductor device comprises:
depositing a material over the substrate;
aligning a mask over the gate layer;
patterning the material to define the gate and the local interconnect coupling the gate to the via contact; and
removing portions of the material adjacent to the gate and/or the via contact.

6. The method of claim 5, wherein the material is metallic.

7. The method of claim 1, wherein a dummy gate is not formed at a location corresponding to the gate of the semiconductor device.

8. The method of claim 1, wherein forming the gate occurs after the isolating.

9. The method of claim 1, wherein isolating the first portion of the substrate from the third portion of the substrate comprises: removing a fourth portion of the substrate coupling the first and third portions of the substrate.

10. The method of claim 9, wherein:
the substrate is a silicon-on-insulator (SOI) substrate; and
the fourth portion of the substrate borders on the first portion of the substrate, on the third portion of the substrate, and on a buried oxide layer of the substrate.

11. The method of claim 9, wherein: after the fourth portion of the substrate is removed, the first and third portions of the substrate are not coupled to each other by a layer of the substrate in which doped regions of the semiconductor device and the second semiconductor are formed.

12. The method of claim 1, wherein isolating the first portion of the substrate from the third portion of the substrate comprises: removing, from a rectangular box-shaped region of a layer of the substrate that includes the first and third portions of the substrate, at least 60% of portions of the layer of substrate which correspond to neither a via contact, nor a doped region of a semiconductor device, nor a body of a semiconductor device.

13. The method of claim 1, wherein isolating the first portion of the substrate from the third portion of the substrate comprises:
providing a second mask layer above a first mask layer, the first mask layer being configured to define the doped region and the via contact during the doping step;
chemically-mechanically polishing the second mask layer;
removing the first mask layer; and
etching portions of the substrate not under the second mask layer.

14. The method of claim 13, further comprising, prior to the doping:
providing the first mask layer above the substrate; and
opening portions of the mask layer corresponding to the doped region and the via contact.

15. A method, comprising:
doping, in a same processing step, first and second portions of a substrate of an integrated circuit, the first portion corresponding to a doped region of a semiconductor device, and the second portion corresponding to a via contact; and
after the doping, forming the gate of the semiconductor device; and
after the doping, isolating the first portion of the substrate from a third portion of the substrate corresponding to a doped region of a second semiconductor device,
wherein the substrate comprises silicon that is fully or partially depleted.

16. The method of claim 15, wherein the substrate is a fully-depleted silicon-on-insulator (FDSOI) substrate.

17. The method of claim 15, wherein a thickness of a silicon layer of the substrate is between 2 nm and 35 nm.

18. A method, comprising:
doping, in a same processing step, first and second portions of a substrate of an integrated circuit, the first portion corresponding to a doped region of a semiconductor device, and the second portion corresponding to a via contact; and
after the doping, forming the gate of the semiconductor device; and
after the doping, isolating the first portion of the substrate from a third portion of the substrate corresponding to a doped region of a second semiconductor device,
wherein the semiconductor device is a non-planar semiconductor device.

19. The method of claim 18, wherein the non-planar semiconductor device is a finFET.

20. The method of claim 18, wherein the non-planar semiconductor device comprises a multi-gate transistors, finFET, delta transistor, pi-gate finFET, omega-gate ($\Omega$-gate) finFET, gate-all-around finFET, or flexFET.

21. The method of claim 18, wherein:
the non-planar semiconductor device includes a fin, and
the fin includes: at least a portion of the doped region of the non-planar semiconductor device, and at least a portion of a body of the non-planar semiconductor device.

22. The method of claim 18, wherein a portion of the gate of the non-planar semiconductor device is beside and/or below a body of the non-planar semiconductor device.

23. The method of claim 22, wherein a second portion of the gate of the non-planar semiconductor device is above the body of the non-planar device.

24. An integrated circuit comprising the semiconductor device fabricated by the method of claim 1.

25. An integrated circuit comprising an SRAM cell, the SRAM cell including the semiconductor device fabricated by the method of claim 1.

* * * * *

UNITED STATES PATENT AND TRADEMARK OFFICE
CERTIFICATE OF CORRECTION

PATENT NO. : 9,111,801 B2
APPLICATION NO. : 13/856985
DATED : August 18, 2015
INVENTOR(S) : John H. Zhang Page 1 of 1

It is certified that error appears in the above-identified patent and that said Letters Patent is hereby corrected as shown below:

IN THE CLAIMS

Column 18, Line 39:
"conductor device comprises a multi-gate transistors, finFET," should read, --conductor device comprises a multi-gate transistor, finFET,--.

Signed and Sealed this
Sixteenth Day of February, 2016

Michelle K. Lee
*Director of the United States Patent and Trademark Office*